United States Patent
Sano et al.

(10) Patent No.: US 9,502,233 B2
(45) Date of Patent: Nov. 22, 2016

(54) METHOD FOR MANUFACTURING SEMICONDUCTOR DEVICE, METHOD FOR PROCESSING SUBSTRATE, SUBSTRATE PROCESSING DEVICE AND RECORDING MEDIUM

(71) Applicant: HITACHI KOKUSAI ELECTRIC INC., Tokyo (JP)

(72) Inventors: Atsushi Sano, Toyama (JP); Masayuki Asai, Toyama (JP); Masahiro Yonebayashi, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 14/386,223

(22) PCT Filed: Mar. 22, 2013

(86) PCT No.: PCT/JP2013/058321
§ 371 (c)(1),
(2) Date: Sep. 18, 2014

(87) PCT Pub. No.: WO2013/141370
PCT Pub. Date: Sep. 26, 2013

(65) Prior Publication Data
US 2015/0099373 A1 Apr. 9, 2015

(30) Foreign Application Priority Data
Mar. 22, 2012 (JP) .................. 2012-066332
Mar. 18, 2013 (JP) .................. 2013-054711

(51) Int. Cl.
*H01L 21/02* (2006.01)
*C23C 16/44* (2006.01)
*H01J 37/32* (2006.01)

(52) U.S. Cl.
CPC ......... *H01L 21/022* (2013.01); *C23C 16/4405* (2013.01); *H01J 37/32394* (2013.01); *H01J 37/32862* (2013.01); *H01L 21/0217* (2013.01)

(58) Field of Classification Search
CPC ........... C23C 16/4405; C23C 14/564; C23C 16/4412; B08B 5/00; H01L 21/02057; H01L 21/67253
USPC ........................................ 438/694, 771, 776
See application file for complete search history.

(56) References Cited

U.S. PATENT DOCUMENTS 5,685,949 A * 11/1997 Yashima ........... H01J 37/32082
134/1.1
5,812,403 A * 9/1998 Fong .................... B08B 7/0035
134/1.1

(Continued)

FOREIGN PATENT DOCUMENTS

JP 06-326034 A 11/1994
JP 08-250488 A 9/1996

(Continued)

Primary Examiner — Stephen W Smoot
Assistant Examiner — Edward Chin
(74) Attorney, Agent, or Firm — Volpe and Koenig, P.C.

(57) ABSTRACT

In order to extend the cycle of gas cleaning for a film-forming device, a method for manufacturing a semiconductor device includes: a substrate carry-in process for carrying a substrate into a processing chamber; a film forming process for laminating at least two types of films on the substrate in the processing chamber; a substrate carry-out process for carrying the film laminated substrate out from the processing chamber; an etching process for supplying an etching gas into the processing chamber while the substrate is not in the processing chamber after the substrate carry-out process. The etching process includes a first cleaning process for supplying a fluorine-containing gas activated by plasma excitation into the processing chamber as an etching gas; and a second cleaning process for supplying a fluorine-containing gas activated by heat into the processing chamber as an etching gas.

16 Claims, 20 Drawing Sheets

(56) References Cited

U.S. PATENT DOCUMENTS

| | | | | |
|---|---|---|---|---|
| 6,061,138 | A * | 5/2000 | Gibbons | G02F 1/133788 356/400 |
| 6,307,609 | B1 * | 10/2001 | Gibbons | G02F 1/133788 349/123 |
| 7,133,112 | B1 * | 11/2006 | Choi | G02F 1/133753 349/123 |
| 7,897,971 | B2 * | 3/2011 | Kurokawa | H01L 27/0248 257/57 |
| 8,067,775 | B2 * | 11/2011 | Miyairi | H01L 27/1225 257/72 |
| 8,227,278 | B2 * | 7/2012 | Sasagawa | H01L 27/1214 257/E21.414 |
| 8,366,953 | B2 * | 2/2013 | Kohno et al. | 216/37 |
| 8,384,079 | B2 * | 2/2013 | Yamazaki | G02F 1/136227 257/43 |
| 2003/0221779 | A1 * | 12/2003 | Okuda | C23C 16/4405 156/345.26 |
| 2004/0008310 | A1 * | 1/2004 | Leidig | G02F 1/133634 349/124 |
| 2005/0252451 | A1 * | 11/2005 | Beppu | B08B 7/0035 118/719 |
| 2009/0308840 | A1 * | 12/2009 | Kohno | C23C 16/4405 216/37 |
| 2010/0093139 | A1 * | 4/2010 | Futase | H01L 21/28052 438/197 |
| 2010/0127265 | A1 * | 5/2010 | Kim | H01L 29/41733 257/59 |
| 2010/0154835 | A1 | 6/2010 | Dimeo et al. | |
| 2010/0225864 | A1 * | 9/2010 | Inoue | G02F 1/133788 349/123 |
| 2012/0293763 | A1 * | 11/2012 | Inoue | G03F 1/50 349/178 |
| 2013/0194528 | A1 * | 8/2013 | Wang | G02F 1/13306 349/43 |
| 2013/0293819 | A1 * | 11/2013 | Liao | G02F 1/1345 349/142 |
| 2014/0319526 | A1 * | 10/2014 | Choi | H01L 29/41733 257/59 |
| 2014/0360860 | A1 * | 12/2014 | Miyachi | G02F 1/133788 204/157.69 |

FOREIGN PATENT DOCUMENTS

| | | |
|---|---|---|
| JP | 2003-037105 A | 2/2003 |
| JP | 3985899 B2 | 10/2007 |
| JP | 2008-060171 A | 3/2008 |
| JP | 2010503977 A | 2/2010 |

* cited by examiner

METHOD FOR MANUFACTURING SEMICONDUCTOR DEVICE, METHOD FOR PROCESSING SUBSTRATE, SUBSTRATE PROCESSING DEVICE AND RECORDING MEDIUM

TECHNICAL FIELD

The present disclosure relates to a method for manufacturing a semiconductor device, a method for processing a substrate, a substrate processing device and a recording medium.

BACKGROUND

As examples of a thin film-forming method used in manufacturing a semiconductor device, methods such as physical vapor deposition (PVD) such as sputtering or the like and chemical vapor deposition (CVD) using a chemical reaction may be utilized. In forming a silicon nitride film ($SiN(Si_3N_4)$) through CVD, there has been well-know CVD methods using $SiH_2Cl_2$ and $NH_3$. In recent years, there is also used a film-forming method in which a silicon nitride film is formed by alternately supplying $SiH_2Cl_2$ and $NH_3$. In these film-forming methods, by heating an entirety of a processing chamber, a substrate to be processed within the processing chamber is heated to a desired temperature for forming a silicon nitride film. Thus, while the silicon nitride film is formed on the substrate, the processing chamber is also heated to substantially the same temperature so that a silicon nitride film is also formed on walls of the processing chamber. Therefore, as the process for forming the silicon nitride film is repeated, a cumulative film of SiN is formed on the inner walls of the processing chamber. If a thickness of such cumulative film exceeds a certain level, the cumulative silicon nitride film may begin to separate from the walls. This may cause particles to be generated in the processing chamber. It is assumed that the separation of the cumulative film is mainly caused by a difference in thermal expansion coefficients between the silicon nitride film and the processing chamber walls or a stress generated within the silicon nitride film.

If the cumulative silicon nitride film begins to separate, a cleaning operation for removing the cumulative film is performed in order to reduce the particles. As examples of the cleaning operation, there have been known a wet cleaning method in which a film-forming apparatus is first stopped from operation and target components thereof are immersed in a chemical liquid such as a hydrofluoric acid or the like to remove the cumulative film through an in-liquid reaction, and a dry cleaning or gas cleaning method may be utilized in which a cleaning gas is introduced into a processing chamber, as in the film-forming process, to remove the cumulative film through a reaction of the film with etching species activated by heat or the like (see Patent Document 1).

PRIOR ART DOCUMENTS

Patent Document 1: Japanese Patent No. 3985899

For cleaning a film-forming apparatus, the gas cleaning for the cumulative silicon nitride film is performed multiple times. Thereafter, if the cumulative silicon nitride film is not sufficiently removed by the gas cleaning, then the operation of the film-forming apparatus is stopped and disassembled to perform the wet cleaning.

Since the film-forming apparatus needs to be disassembled and opened to the atmosphere in the course of the wet cleaning and also needs to be set up after the cleaning, it takes a long time to resume the operation of the film-forming apparatus. Thus, there is a need to extend a period of maintenance that requires the wet cleaning. To this end, there is also a need to extend a period of maintenance that requires the gas cleaning for the cumulative film removal, which leads the film-forming apparatus to keep in an operable state and increase its operation rate.

SUMMARY

Accordingly, the present disclosure provides some embodiments of a method for manufacturing a semiconductor device, a method for processing a substrate, a substrate processing device and a recording medium, which extends a period that requires a gas cleaning of an apparatus for forming a film such as a silicon nitride film or the like.

According to an aspect of the present disclosure, there is provided a method of manufacturing a semiconductor device, including: loading a substrate into a processing chamber; forming at least two kinds of films on the substrate within the processing chamber; unloading the substrate having the films formed thereon from the processing chamber; and after unloading the substrate, etching by supplying an etching gas into the processing chamber, without any substrate within the processing chamber. The act of etching includes a first cleaning of supplying a fluorine-containing gas activated by plasma excitation as the etching gas into the processing chamber, and a second cleaning of supplying a fluorine-containing gas activated by heat as the etching gas into the processing chamber.

According to another aspect of the present disclosure, there is provided a method of processing a substrate, including: loading one or more substrates into a processing chamber; forming at least two kinds of films on the substrate within the processing chamber; unloading the one or more substrates having the films formed thereon from the processing chamber; and after unloading all the substrates, etching by supplying an etching gas into the processing chamber, without any substrate within the processing chamber. The act of etching includes a first cleaning of supplying a fluorine-containing gas activated by plasma excitation as the etching gas into the processing chamber, and a second cleaning of supplying a fluorine-containing gas activated by heat as the etching gas into the processing chamber.

According to still another aspect of the present disclosure, there is provided a substrate processing device, including: a processing chamber configured to process a substrate; a process gas supply system configured to supply a process gas into the processing chamber; an etching gas supply system configured to supply a fluorine-containing gas as an etching gas into the processing chamber; a plasma excitation unit configured to plasma-excite the fluorine-containing gas; a heating unit configured to heat the processing chamber; an exhaust system configured to exhaust the processing chamber; and a control unit configured to, by controlling the process gas supply system, the etching gas supply system, the plasma excitation unit, the heating unit and the exhaust unit, supply the process gas into the processing chamber, form at least two kinds of films on the substrate within the processing chamber, and then execute, without any substrate within the processing chamber, a first cleaning of supplying the fluorine-containing gas activated by plasma excitation into the processing chamber, and a second cleaning of supplying the fluorine-containing gas activated by heat into the processing chamber.

According to still another aspect of the present disclosure, there is provided a non-transitory computer-readable recording medium storing a program that causes a computer to perform processes of: loading a substrate into a processing chamber; forming at least two kinds of films on the substrate within the processing chamber; unloading the substrate having the films formed thereon from the processing chamber; and after unloading the substrate, etching by supplying an etching gas into the processing chamber without any substrate within the processing. The act of etching includes a first cleaning of supplying a fluorine-containing gas activated by plasma excitation as the etching gas into the processing chamber, and a second cleaning of supplying a fluorine-containing gas activated by heat as the etching gas into the processing chamber.

According to the present disclosure, it is possible to extend a period of maintenance that requires the gas cleaning of an apparatus for forming a film such as a silicon nitride film.

DETAILED DESCRIPTION

Hereinafter, embodiments of the present disclosure will be described in detail with reference to the drawings.

Figure 1:
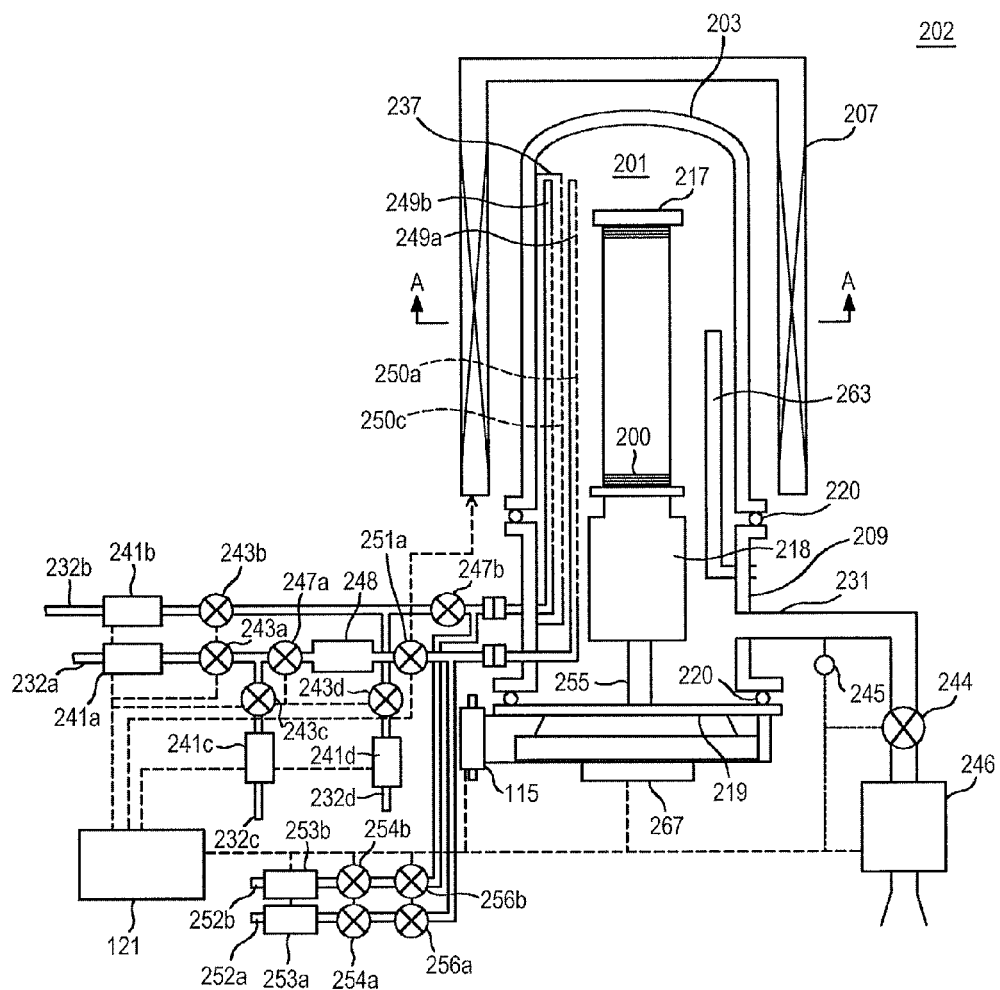
FIG. 1 is a schematic vertical sectional view illustrating a substrate processing device according to some embodiments of the present disclosure.
Figure 2:
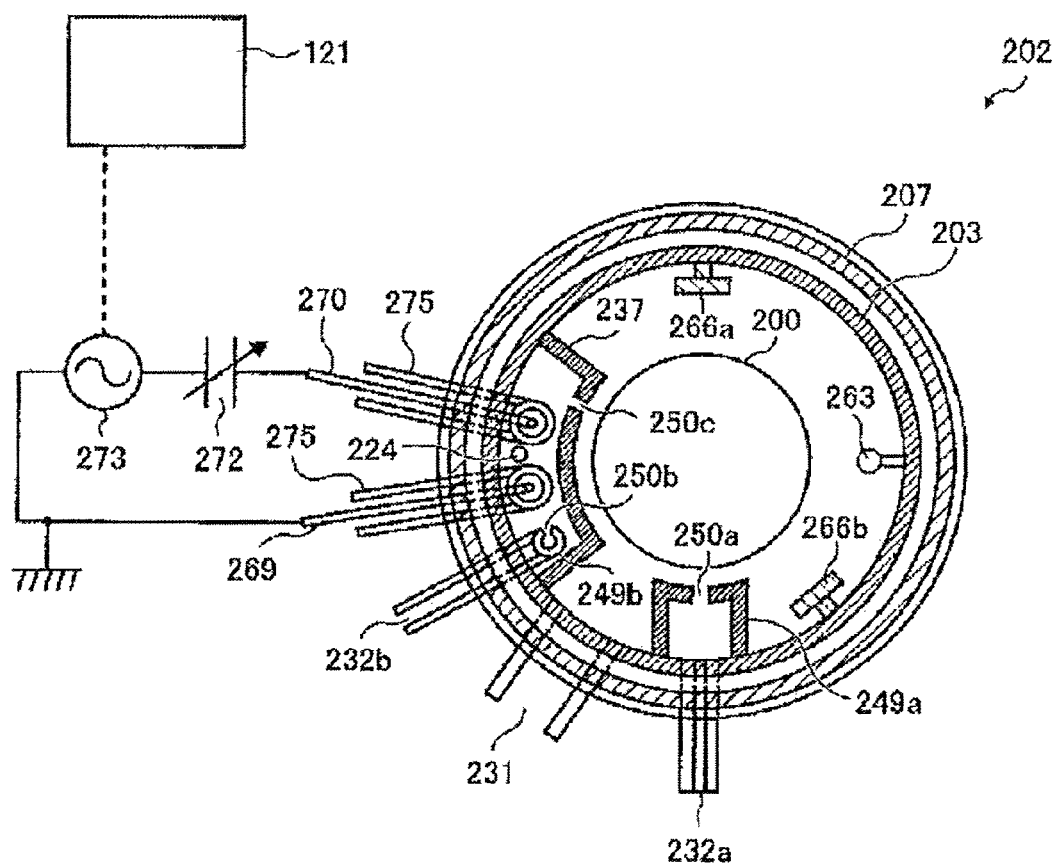
FIG. 2 is a schematic horizontal sectional view taken along line A-A in FIG. 1.
Figure 3:
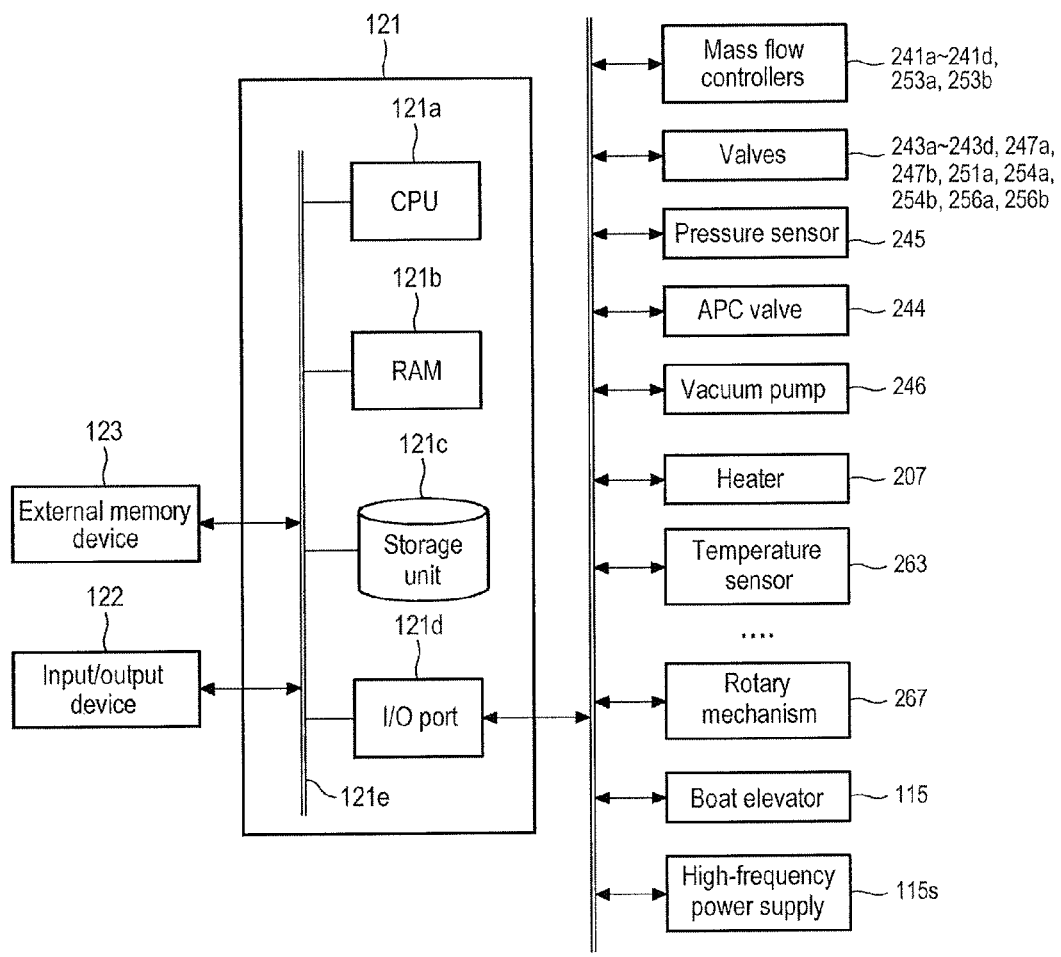
FIG. 3 is a schematic view illustrating a configuration of a controller of a substrate processing device, which includes a control system, according to some embodiments of the present disclosure.

FIG. 1 is a schematic configuration view of a vertical processing furnace 202 of a substrate processing device according to some embodiments of the present disclosure, in which the processing furnace 202 is shown in a longitudinal cross section. FIG. 2 is a schematic configuration view of the vertical processing furnace 202 of the substrate processing device, in which the processing furnace 202 is shown in a horizontal cross section. FIG. 3 is a schematic view illustrating a configuration of a controller 121 of a substrate processing device, which shows a control system of the controller 121 as a block diagram, according to some embodiments of the present disclosure.

As shown in FIG. 1, the processing furnace 202 includes a heater 207 as a heating means (heating mechanism). The heater 207 has a cylindrical shape and is supported by a heater base (not shown) as a support plate so as to be vertically installed. A reaction tube 203 defining a reaction vessel (processing vessel) is disposed inside the heater 207 in a concentric form with the heater 207.

A manifold 209 is installed under the reaction tube 203. Annular flanges are respectively installed in a lower end portion of the reaction tube 203 and an upper open end portion of the manifold 209. A sealing member (hereinafter, referred to as an O-ring) 220 is interposed between the flanges, whereby a gap between the flanges is air-tightly sealed.

A seal cap 219, which functions as a furnace port cover configured to hermetically seal a lower end opening of the reaction tube 203 is installed below the manifold 209. The seal cap 219 is configured to contact the lower end of the manifold 209 from the below in the vertical direction. The seal cap 219 may be, for example, made of a metal such as stainless steel or the like and has a disc shape. An O-ring 220, which is a sealing member in contact with the lower end of the manifold 209, is installed at an upper surface of the seal cap 219. A processing chamber 201 is defined by at least the reaction tube 203, the manifold 209 and the seal cap 219. A rotary mechanism 267 configured to rotate a boat is installed at the opposite side of the seal cap 219 from the processing chamber 201. A rotary shaft 255 of the rotary mechanism 267 is connected to a boat 217, which will be described later, through the seal cap 219. The rotary shaft 255 is configured to rotate wafers 200 by rotating the boat 217. The seal cap 219 is configured to be vertically elevated or lowered by a boat elevator 115, which is an elevation mechanism installed at the outside the reaction tube 203, whereby the boat 217 can be carried into and out of the processing chamber 201. Furthermore, the processing chamber 201 may be generally regarded as a chamber (or a space) for processing substrates such as the wafers 200 or the like. As mentioned above, in the present disclosure, the processing chamber 201 includes a space defined by the reaction tube 203, the manifold 209 and the seal cap 219. In a broad sense, a buffer chamber 237 described later may be included in the processing chamber 201.

A boat 217, which is a substrate holding means (support member), is installed upright on the seal cap 219 with a quartz cap 218 as a heat insulating member interposed therebetween. The quartz cap 218 made of a heat-resistant material such as quartz or silicon carbide serves as a heat insulating member and becomes a holding body that holds the boat 217. The boat 217 is made of a heat-resistant material such as quartz or silicon carbide and is configured to support a plurality of wafers 200, which are horizontally stacked in multiple stages with the centers thereof aligned with one another along an axial direction.

In the manifold 209, a first nozzle 249a and a second nozzle 249b are installed to pass through the manifold 209. A first gas supply pipe 232a is connected to the first nozzle 249a. A second gas supply pipe 232b is connected to the second nozzle 249b.

In the first gas supply pipe 232a, a mass flow controller (MFC) 241a as a flow rate controller (flow rate control unit), valves 243a and 247a as on/off valves, a gas buffer 248 and a valve 251a as an on/off valve are installed in this order from an upstream side. The gas buffer 248 is formed of, e.g., a gas tank or a spiral pipe which is larger in capacity than a typical pipe. By opening and closing the valve 247a or the valve 251a, as described later, a dichlorosilane ($SiH_2Cl_2$, DCS) gas, as a first process gas, may be retained in the gas buffer 248 or may be supplied into the processing chamber 201 through the first gas supply pipe 232a. Furthermore, an inert gas supply pipe 232c is connected to the first gas supply pipe 232a. In the inert gas supply pipe 232c, a mass flow controller 241c as a flow rate controller (flow rate control unit) and a valve 243c as an on/off valve are installed in this order from an upstream side. The first nozzle 249a is connected to a distal end portion of the first gas supply pipe 232a. The first nozzle 249a is installed in an arc-shaped space existing between the inner wall of the reaction tube 203 and the wafers 200 so as to extend from the lower portion to the upper portion of the inner wall of the reaction tube 203 toward the upper side in the stacking direction of the wafers 200. The first nozzle 249a is formed of an L-shape elongated nozzle. Gas supply holes 250a for supplying a gas therethrough are formed on a side surface of the first nozzle 249a. The gas supply holes 250a are opened toward the center of the reaction tube 203. The gas supply holes 250a are formed in a plural number over a region spanning from the lower portion to the upper portion of the reaction tube 203. The gas supply holes 250a are equal to one another in terms of their opening area and are disposed at an equal opening pitch. A first gas supply system is mainly configured by the first gas supply pipe 232a, the mass flow controller 241a, the valves 243a and 247a, the gas buffer 248, the valve 251a and the first nozzle 249a. Moreover, a first inert gas supply system is mainly configured by the inert gas supply pipe 232c, the mass flow controller 241c and the valve 243c.

A first cleaning gas supply pipe 252a is connected to the first gas supply pipe 232a at the downstream side of the valve 251a. In the first cleaning gas supply pipe 252a, a mass flow controller 253a as a flow rate controller (flow rate control unit), a valve 254a as an on/off valve and a valve 256a as an on/off valve are installed in this order from the upstream side. A first cleaning gas supply system is mainly configured by the first cleaning gas supply pipe 252a, the mass flow controller 253a and the valves 254a and 256a. A second cleaning gas supply pipe 252b is connected to the second gas supply pipe 232b at the downstream side of the valve 247b. In the second cleaning gas supply pipe 252b, a mass flow controller 253b as a flow rate controller (flow rate control unit), a valve 254b as an on/off valve and a valve 256h as an on/off valve are installed in this order from the upstream side. A second cleaning gas supply system is mainly configured by the second cleaning gas supply pipe 252b, the mass flow controller 253b and the valves 254b and 256b.

In the second gas supply pipe 232b, a mass flow controller (MFC) 241b as a flow rate controller (flow rate control unit) and valves 243b and 247b as on/off valves are installed in this order from the upstream side. An inert gas supply pipe 232d is connected to the second gas supply pipe 232b at the downstream side of the valve 243b. In the inert gas supply pipe 232d, a mass flow controller 241d as a flow rate controller (flow rate control unit) and a valve 243d as an on/off valve are installed in this order from the upstream side. The second nozzle 249b is connected to a distal end portion of the second gas supply pipe 232b. The second nozzle 249b is installed within a buffer chamber 237 which is a gas diffusion space.

The buffer chamber 237 is installed in an arc-shaped space existing between the inner wall of the reaction tube 203 and the wafers 200 and is disposed in a region spanning from the lower portion to the upper portion of the inner wall of the reaction tube 203 so as to extend along the stacking direction of the wafers 200. Gas supply holes 250c for supplying a gas therethrough are formed in the wall of the buffer chamber 237 that is adjacent to the wafers 200. The gas supply holes 250c are opened toward the center of the reaction tube 203. The gas supply holes 250c are formed in a plural number over a region spanning from the lower portion to the upper portion of the reaction tube 203. The gas supply holes 250c are equal to one another in terms of their opening area and are disposed at an equal opening pitch.

The second nozzle 249b is installed in the opposite end portion of the buffer chamber 237 from the end portion in which the gas supply holes 250c are formed. The second nozzle 249b is installed to extend from the lower portion to the upper portion of the inner wall of the reaction tube 203 toward the upper side in the stacking direction of the wafers 200. The second nozzle 249b is formed of an L-shaped elongated nozzle. Gas supply holes 250b for supplying a gas therethrough are formed on a side surface of the second nozzle 249b. The gas supply holes 250b are opened toward the center of the buffer chamber 237. Like the gas supply holes 250c of the buffer chamber 237, the gas supply holes 250b are formed in a plural number over a region spanning from the lower portion to the upper portion of the reaction tube 203. If a differential pressure between the internal pressure of the buffer chamber 237 and the internal pressure of the processing chamber 201 is low, the respective gas supply holes 250b may be formed to have an equal opening area and an equal opening pitch from the upstream side (the lower portion) to the downstream side (the upper portion). However, if the differential pressure is high, the opening area may be adjusted to be larger from the upstream side toward the downstream side, or the opening pitch may be adjusted to be smaller from the upstream side toward the downstream side.

In the present embodiment, by adjusting the opening area or the opening pitch of the gas supply hole 250*b* in the aforementioned manner over a region spanning from the upstream side toward the downstream side, gases may be ejected from the gas supply holes 250*b* at different flow velocities but at an almost equal flow rate. The gases ejected from the gas supply holes 250*b* are first introduced into the buffer chamber 237 where a flow velocity difference of the gases is uniformized.

That is, the gases ejected from the gas supply holes 250*b* of the second nozzle 249*b* into the buffer chamber 237 may be ejected from the gas supply holes 250*c* of the buffer chamber 237 into the processing chamber 201 after the particle velocity of the respective gases is reduced within the buffer chamber 237. Thus, the gases ejected from the respective gas supply holes 250*b* into the buffer chamber 237 may be ejected from the respective gas supply holes 250*c* into the processing chamber 201 at a uniform flow rate and at a uniform flow velocity.

A second gas supply system is mainly configured by the second gas supply pipe 232*b*, the mass flow controller 241*b*, the valves 243*b* and 247*b*, the second nozzle 249*b* and the buffer chamber 237. A second inert gas supply system is mainly configured by the inert gas supply pipe 232*d*, the mass flow controller 241*d* and the valve 243*d*.

For example, a silicon source gas, i.e., a gas containing a silicon (Si) as a first element (a silicon-containing gas), is supplied as a first process gas from the first gas supply pipe 232*a* into the processing chamber 201 through the mass flow controller 241*a*, the valves 243*a* and 247*a*, the gas buffer 248, the valve 251*a* and the first nozzle 249*a*. Examples of the silicon-containing gas may include a dichlorosilane ($SiH_2Cl_2$, DCS) gas, a hexachlorodisilane ($Si_2Cl_6$) gas and a hexamethyldisilazane ($C_6H_{19}NSi_2$, HMDS) gas. Although the first process gas may be any one of a solid, a liquid and a gas at a normal temperature and at a normal pressure, in the present embodiment, the first process gas will be described as being a gas. If the first process gas is a liquid at a normal temperature and at a normal pressure, a vaporizer (not shown) may be installed.

For example, a gas containing nitrogen (N) as a second element (a nitrogen-containing gas) is supplied as a second process gas for modification of the a source gas from the second gas supply pipe 232*b* into the processing chamber 201 through the mass flow controller 241*b*, the valves 243*b* and 247*b* and the second nozzle 249*b*. Examples of the nitrogen-containing gas may include an ammonia ($NH_3$) gas.

Inert gases, e.g., nitrogen ($N_2$) gas, are respectively supplied from the inert gas supply pipes 232*c* and 232*d* into the processing chamber 201 through the mass flow controller 241*c*, the valve 243*c*, the first gas supply pipe 232*a* and the first nozzle 249*a* or through the mass flow controller 241*d*, the valve 243*d*, the second gas supply pipe 232*b* and the second nozzle 249*b*.

A cleaning gas, e.g., a nitrogen trifluoride (NF3) gas, is supplied from the first cleaning gas supply pipe 252*a* into the processing chamber 201 through the mass flow controller 253*a*, the valves 254*a* and 256*a*, the first gas supply pipe 232*a* and the first nozzle 249*a*.

A cleaning gas, e.g., a nitrogen trifluoride ($NF_3$) gas, is supplied from the second cleaning gas supply pipe 252*b* into the processing chamber 201 through the mass flow controller 253*b*, the valves 254*b* and 256*b*, the second gas supply pipe 232*b*, the second nozzle 249*b* and the buffer chamber.

For example, in case where the aforementioned gases are supplied from the respective gas supply pipes, a source gas supply system, namely a silicon-containing gas supply system (a silane-based gas supply system), is configured by the first gas supply system. Furthermore, a modifying gas supply system, namely a nitrogen-containing gas supply system, is configured by the second gas supply system.

As shown in FIGS. 1 and 2, a first rod-shaped electrode 269 as a first electrode and a second rod-shaped electrode 270 as a second electrode, both of which have an elongated shape, are disposed within the buffer chamber 237 so as to extend from the lower portion to the upper portion of the reaction tube 203 along the stacking direction of the wafers 200. The first rod-shaped electrode 269 and the second rod-shaped electrode 270 are installed parallel to the second nozzle 249*b* and are covered and protected by electrode protection tubes 275 for the protection of the respective electrodes, which extend from the upper portion to the lower portion of the reaction tube 203. One of the first rod-shaped electrode 269 and the second rod-shaped electrode 270 is connected to a high-frequency power supply 273 through a matcher 272, and the other is connected to a ground as a reference potential. As a result, plasma is generated in a plasma generation region 224 existing between the first rod-shaped electrode 269 and the second rod-shaped electrode 270. A plasma source as a plasma generator (plasma generating unit) is mainly configured by the first rod-shaped electrode 269, the second rod-shaped electrode 270, the electrode protection tubes 275, the matcher 272 and the high-frequency power supply 273. The plasma source functions as an activating mechanism that activates gases into plasma as described later.

The electrode protection tubes 275 have a structure which allows each of the first rod-shaped electrode 269 and the second rod-shaped electrode 270 to be inserted into the buffer chamber 237 in a state where each of the first rod-shaped electrode 269 and the second rod-shaped electrode 270 is isolated from an internal atmosphere of the buffer chamber 237. In this manner, if an internal atmosphere of the electrode protection tubes 275 is the same as an ambient air (the atmosphere), each of the first rod-shaped electrode 269 and the second rod-shaped electrode 270 inserted into the electrode protection tubes 275 is oxidized by the heat generated from the heater 207. For that reason, there is installed an inert gas purging mechanism (not shown) that prevents oxidation of the first rod-shaped electrode 269 or the second rod-shaped electrode 270 by charging or purging the inside of the electrode protection tubes 275 with an inert gas such as nitrogen gas so as to sufficiently reduce an oxygen concentration within the electrode protection tubes 275.

An exhaust pipe 231 for exhausting an internal atmosphere of the processing chamber 201 is installed at the reaction tube 203. A vacuum exhaust device, for example, a vacuum pump 246, is connected to the exhaust pipe 231 through a pressure sensor 245, which is a pressure detector (pressure detecting unit) for detecting the internal pressure of the processing chamber 201 and an APC (Auto Pressure Controller) valve 244, which is a pressure adjuster (pressure adjusting part) so as to perform vacuum exhaust such that the internal pressure of the processing chamber 201 becomes a predetermined pressure (vacuum degree). The APC valve 244 is an on/off valve which is configured to perform/stop vacuum exhaust of the inside of the processing chamber 201 by opening/closing the valve and to adjust the internal pressure of the processing chamber 201 by adjusting a degree of the valve opening. An exhaust system (or an exhaust line) is mainly configured by the exhaust pipe 231, the APC valve 244 and the pressure sensor 245. The vacuum pump 246 may be included in the exhaust system. Moreover, a trap device or a detoxifying device may be included in the exhaust system.

A temperature sensor 263, which is a temperature detector, is installed within the reaction tube 203. Based on the temperature information detected by the temperature sensor 263, the supply of electric power to the heater 207 is controlled such that the inside of the processing chamber 201 has a desired temperature distribution. Similarly to the nozzles 249a and 249b, the temperature sensor 263 is formed in an L-shape and installed along the inner wall of the reaction tube 203.

Within the reaction tube 203, there are installed quartz-made plate members 266a and 266b to be used for checking a removal state of attached film in the reaction tube 203 after a cleaning gas is supplied, as described later. The plate members 266a and 266b are installed to extend from the lower portion to the upper portion of the inner wall of the reaction tube 203 along the stacking direction of the wafers 200. For instance, the plate member 266a may be disposed on the inner wall surface of the reaction tube 203 at an opposite position to the gas supply holes 250a of the first nozzle 249a. The plate member 266b may be disposed on the inner wall surface of the reaction tube 203 at a position adjacent to the first nozzle 249a.

As shown in FIG. 3, a controller 121, which is a control unit (control part), is configured as a computer including a CPU (Central Processing Unit) 121a, a RAM (Random Access Memory) 121b, a storage unit 121c, and an I/O port 121d. The RAM 121b, the storage unit 121c and the I/O port 121d are configured to exchange data with the CPU 121a via an internal bus 121e. An input/output device 122, for example, including a touch panel or the like, is connected to the controller 121.

The storage unit 121c may be configured by, for example, a flash memory, a HDD (Hard Disk Drive), or the like. A control program for controlling operation of the substrate processing device, a process recipe, in which a sequence or condition for processing a substrate described later is written, and so forth, are readably stored in the storage unit 121c. The process recipe functions as a program for the controller 121 to execute each sequence in the substrate processing process, which will be described later, to obtain a predetermined result. The RAM 121b is configured as a memory area (work area) in which a program or data read by the CPU 121a is temporarily stored.

The I/O port 121d is connected to the mass flow controllers 241a, 241b, 241c, 241d, 253a and 253b, the valves 243a, 243b, 243c, 243d, 247a, 247b, 251a, 254a, 254b, 256a and 256b, the pressure sensor 245, the APC valve 244, the vacuum pump 246, the heater 207, the temperature sensor 263, the rotary mechanism 267, the boat elevator 115, the high-frequency power supply 273, and so forth.

The CPU 121a may be configured to read and execute the control program from the storage unit 121c. The CPU 121a may be also configured to read the process recipe from the storage unit 121c in response to an operation command inputted from the input/output device 122. The CPU 121a may be configured to control, pursuant to contents of the read process recipe, the flow rate regulating operation for various kinds of gases performed by the mass flow controllers 241a, 241b, 241c, 241d, 253a and 253b, the opening/closing operation of the valves 243a, 243b, 243c, 243d, 247a, 247b, 251a, 254a, 254b, 256a and 256b, the opening/closing operation of the APC valve 244, the pressure regulating operation performed by the APC valve 244 based on the pressure sensor 245, the temperature regulating operation performed by the heater 207 based on the temperature sensor 263, the startup and stop of the vacuum pump 246, the rotating operation and the rotation speed regulating operation performed by the rotary mechanism 267, the elevation operation of the boat 217 performed by the boat elevator 115, the power supply operation of the high-frequency power supply 273, and so forth.

Moreover, the controller 121 is not limited to being configured as a dedicated computer but may be configured as a general-purpose computer. For example, the controller 121 according to the present embodiment may be configured by preparing an external memory device (e.g., a magnetic tape, a magnetic disk such as a flexible disk or a hard disk, an optical disk such as a CD or a DVD, a magneto-optical disk such as an MO or the like, or a semiconductor memory such as a USB memory or a memory card) 123 which stores the aforementioned program, and installing the program on the general-purpose computer through the use of the external memory device 123. In addition, a means for supplying the program to a computer is not limited to the case in which the program is supplied through the external memory device 123. For instance, the program may be supplied using a communication means such as the Internet or a dedicated line, rather than through the external memory device 123. The storage unit 121c or the external memory device 123 is configured as a non-transitory computer-readable recording medium.

A ROM is the recording medium that stores an operation program of the CPU and is configured as a flash memory, a hard disk, or the like. RAM serves as a work area of the CPU. The CPU (Central Processing Unit) constitutes the core of an operation unit and executes the control program stored in the ROM. In response to the instructions transmitted from an operation panel, the CPU executes the respective recipes including, e.g., process recipe, which are stored in a recipe storage unit. The operation unit according to one embodiment of the present disclosure may be implemented on an ordinary computer system without requiring a dedicated system. For example, the operation unit for executing the aforementioned process may be configured by installing a program for executing the aforementioned process on a large-scale machine (supercomputer) from a recording medium (e.g., a flexible disk, a CD-ROM, a USB or the like) which stores the program.

The means for providing this program (e.g., an installer) is arbitrary. This program may be provided not only through a specified recording medium as mentioned above but also through, e.g., a communication line, a communication network or a communication system. In this case, for example, the program may be posted to a bulletin board of a communication network and may be provided through a network by superposing the program on carrier waves. The aforementioned process may be implemented by starting up the program provided and executing the program under the control of an operating system like other application programs.

As one step of a process for manufacturing a semiconductor device using the processing furnace of the aforementioned substrate processing device, one example of a sequence for forming an insulating film on a substrate will now be described. In the following description, the operations of the respective parts that constitute the substrate processing device are controlled by the controller 121.

Hereinafter, one example of a sequence for forming a film by alternately supplying different kinds of gases that contain different kinds of elements will be described.

In the present disclosure, the term "wafer" may be used for referring to not only a wafer per se but also a laminated body (aggregate) of a wafer and certain layers or films formed on a surface of the wafer (that is, a wafer including certain layers or films formed on a surface of the wafer is sometimes referred to as a "wafer"). In the present disclosure, the term "surface of a wafer" may mean a surface (exposed surface) of a wafer per se, or a surface of a specified layer or film formed on the wafer, namely an outermost surface of the wafer as a laminated body.

In the present disclosure, the expression "supplying a specified gas to a wafer" may mean that the specified gas is directly supplied to a surface (exposed surface) of a wafer per se, or that the specified gas is supplied to a surface of a certain layer or film formed on the wafer, namely to an outermost surface of the wafer as a laminated body. In the present disclosure, the expression "forming a certain layer (or film) on a wafer" may mean that the certain layer (or film) is directly formed on the surface (exposed surface) of the wafer per se, or that the certain layer (or film) is formed on the surface of a certain layer or film formed on the wafer, namely on an outermost surface of the wafer as a laminated body.

In the present disclosure, the term "substrate" is interchangeably used with the term "wafer." Thus, with regard to the aforementioned description, the term "wafer" may be replaced by the term "substrate."

Figure 4:
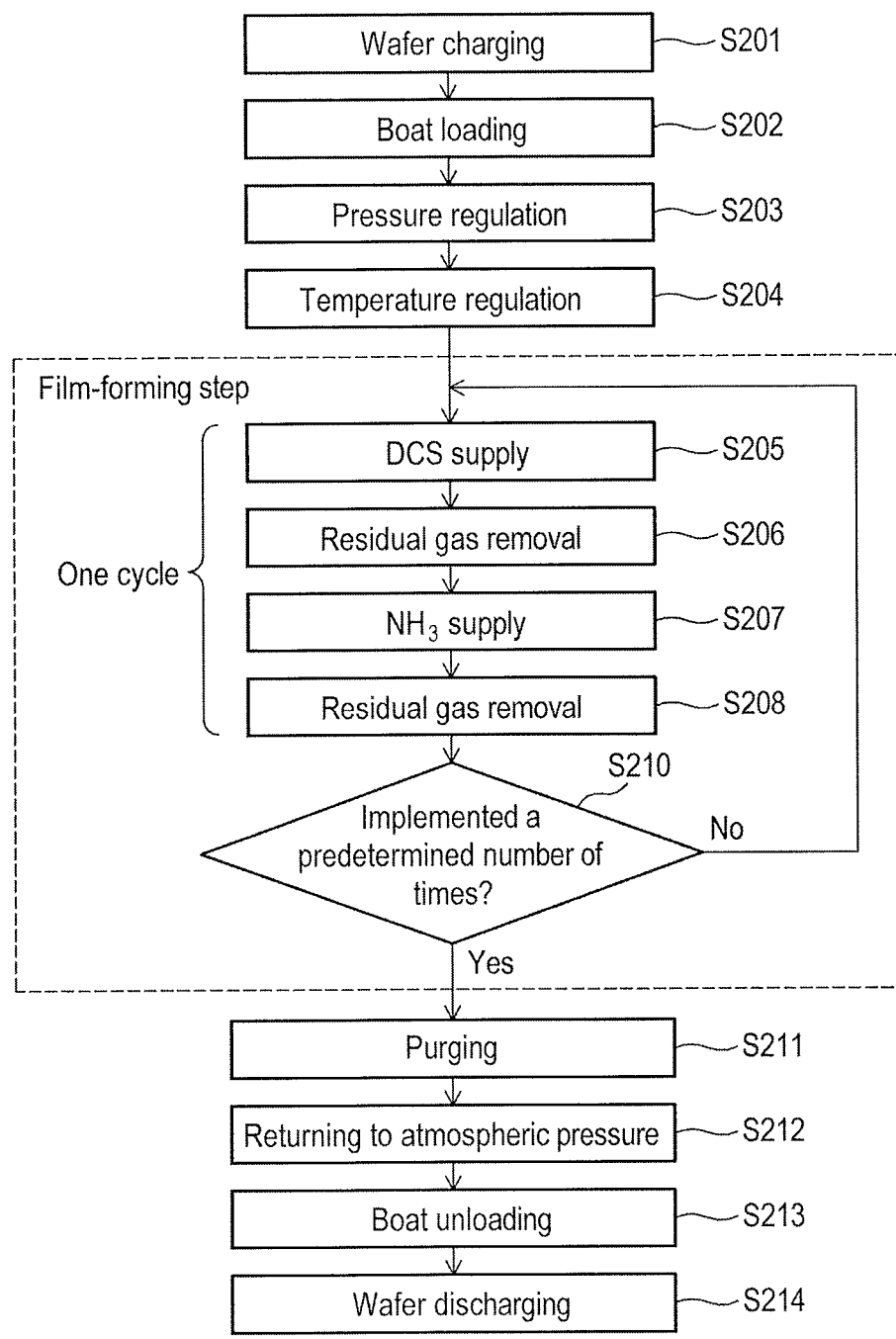
FIG. 4 is a flowchart showing a forming process of a silicon nitride film according to some embodiments of the present disclosure.
Figure 5:
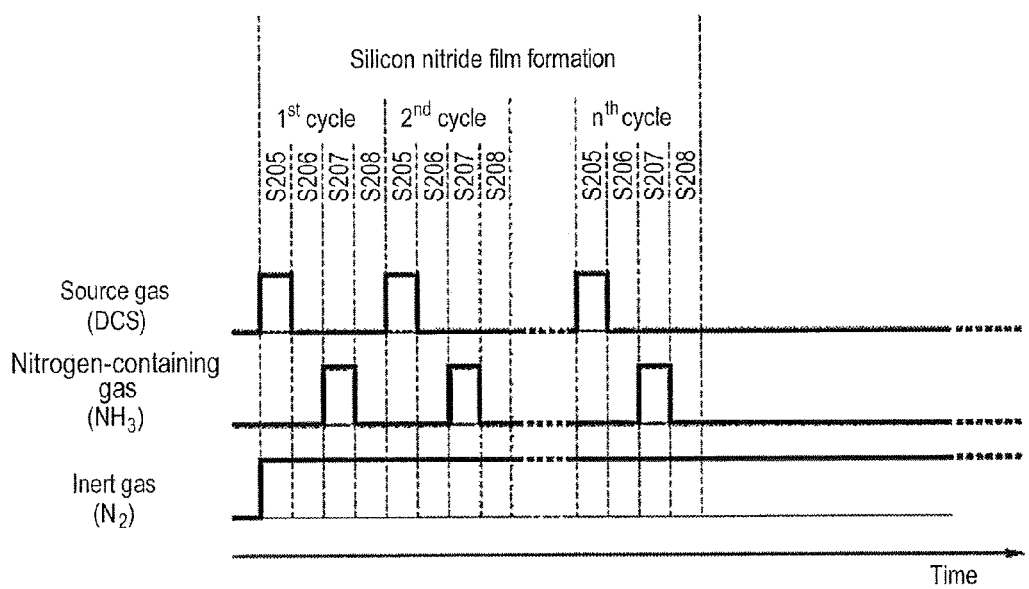
FIG. 5 is a timing chart showing a forming process of a silicon nitride film according to some embodiments of the present disclosure.

An example where an SiN film as an insulating film is formed on a substrate will be described with reference to FIGS. 4 and 5, using silicon (Si) as a first element, using nitrogen (N) as a second element, using a DCS gas (which is a silicon-containing gas) as a first process gas containing the first element, and using a $NH_3$ gas (which is a nitrogen-containing gas) as a second process gas containing the second element. FIG. 4 is a flowchart showing a film-forming process in an embodiment of the present disclosure. FIG. 5 is a view showing a sequence of a film-forming process in an embodiment of the present disclosure. In this example, a silicon-containing gas supply system (a first-element-containing gas supply system) is configured by a first gas supply system. A nitrogen-containing gas supply system (a second-element-containing gas supply system) is configured by a second gas supply system.

First, when a plurality of wafers 200 are charged on the boat 217 (wafer charging) (step S201), as shown in FIG. 1, the boat 217 supporting the plurality of wafers 200 is raised by the boat elevator 115 to be loaded into the processing chamber 201 (boat loading) (step S202). In this state, the seal cap 219 seals the lower end portion of the manifold 209 through the O-ring 220.

The inside of the processing chamber 201 is vacuum-exhausted by the vacuum pump 246 such that the internal pressure of the processing chamber 201 becomes a desired pressure (vacuum degree). At this time, the internal pressure of the processing chamber 201 is measured by the pressure sensor 245. Based on the measured pressure, the APC valve 244 is feedback controlled (pressure regulation) (step S203). Furthermore, the inside of the processing chamber 201 is heated by the heater 207 such that the internal temperature of the processing chamber 201 becomes a desired temperature. At this time, based on the temperature information detected by the temperature sensor 263, the supply of electric power to the heater 207 is feedback-controlled such that the inside of the processing chamber 201 has a desired temperature distribution (temperature regulation) (step S204). Subsequently, the boat 217 is rotated by the rotary mechanism 267, whereby the wafers 200 are rotated. Then, a film-forming process for forming a SiN film is implemented by supplying a DCS gas and an $NH_3$ gas into the processing chamber 201.

[Film-Forming Process]

<Step S205>

In step S205, a DCS gas is first supplied. By opening the valves 243a and 247a or the valve 251a of the first gas supply pipe 232a, the DCS gas is caused to flow into the first gas supply pipe 232a through the gas buffer 248. The flow rate of the DCS gas flowing through the first gas supply pipe 232a is regulated by the mass flow controller 241a. The flow-rate-regulated DCS gas is supplied from the gas supply holes 250a of the first nozzle 249a into the processing chamber 201 and is exhausted from the exhaust pipe 231. At this time, the valve 243c is simultaneously opened such that an inert gas flows through the inert gas supply pipe 232c. A Group XVIII element gas such as a He gas, a Ne gas, an Ar gas or the like is desirable as the inert gas, but, since the temperature of the heater 207, i.e., the temperature of the wafers 200 is set to be low, an $N_2$ gas may be also used. The flow rate of the $N_2$ gas flowing through the inert gas supply pipe 232c is regulated by the mass flow controller 241c. The flow-rate-regulated $N_2$ gas is supplied into the processing chamber 201 together with the DCS gas and is exhausted from the exhaust pipe 231. Due to the supply of the DCS gas, a silicon-containing layer is formed on the surfaces of the wafers 200.

At this time, the APC valve 244 is properly adjusted such that the internal pressure of the processing chamber 201 falls within a range of, e.g., from 10 Pa to 1000 Pa. The supply flow rate of the DCS gas controlled by the mass flow controller 241a is set to fall within a range of, e.g., from 100 sccm to 5000 sccm. The exposure time of the wafers 200 to the DCS gas, namely the gas supply time (irradiation time), is set to fall within a range of, e.g., from 2 seconds to 120 seconds. At this time, the temperature of the heater 207 is set such that the temperature of the wafers 200 falls within a range of, e.g., from 300 degrees C. to 600 degrees C.

<Step S206>

In step S206, after the silicon-containing layer is formed, the valve 243a is closed to stop the supply of the DCS gas. At this time, while the APC valve 244 of the exhaust pipe 231 is opened, the inside of the processing chamber 201 is vacuum-exhausted by the vacuum pump 246, whereby unreacted DCS gas or the DCS gas after the contribution to the formation of the silicon-containing layer, which remains within the processing chamber 201, is removed from the inside of the processing chamber 201. At this time, the valves 243c, 247a and the 251a are opened and the supply of the $N_2$ gas into the processing chamber 201 is maintained. This enhances the removal of the unreacted DCS gas or the DCS gas after the contribution to the formation of the silicon-containing layer, which remains within the processing chamber 201, from the inside of the processing chamber 201. As the inert gas, it may be possible to use, in addition to the $N_2$ gas, a rare gas such as an Ar gas, a He gas, a Ne gas, a Xe gas or the like.

At this time, the gas remaining within the processing chamber 201 may not be completely removed and the inside of the processing chamber 201 may not be completely purged. If a small amount of gas remains within the processing chamber 201, the gas does not adversely affect the step to be performed thereafter. At this time, the flow rate of the $N_2$ gas to be supplied into the processing chamber 201 does not need to be large. For example, when the N$_2$ gas is supplied in a quantity comparable to the volume of the reaction tube 203 (the processing chamber 201), it is possible to perform the purge to a level as not to adversely affect the subsequent step. In case of not completely purging the inside of the processing chamber 201, it is possible to shorten the purge time and to increase the throughput. It is also possible to limit the consumption of the N$_2$ gas to a necessary minimum level.

<Step S207>

In step S207, after the gas remaining within the processing chamber 201 is removed, the valves 243b and 247b of the second gas supply pipe 232b are opened to allow a NH$_3$ gas to flow through the second gas supply pipe 232b. The flow rate of the NH$_3$ gas flowing through the second gas supply pipe 232b is regulated by the mass flow controller 241b. The flow-rate-regulated NH$_3$ gas is supplied from the gas supply holes 250b of the second nozzle 249b into the buffer chamber 237. At this time, high-frequency power is applied from the high-frequency power supply 273 to between the first rod-shaped electrode 269 and the second rod-shaped electrode 270 through the matcher 272. The NH$_3$ gas supplied into the buffer chamber 237 is plasma-excited into active species. The active species are supplied from the gas supply holes 250c into the processing chamber 201 and are exhausted from the exhaust pipe 231. At this time, the valve 243d is simultaneously opened to allow a N$_2$ gas to flow through the inert gas supply pipe 232d. The N$_2$ gas is supplied into the processing chamber 201 together with the NH$_3$ gas and is exhausted from the exhaust pipe 231. By supplying the NH$_3$ gas, the silicon-containing layer formed on the surfaces of the wafers 200 is nitrided. Thus, a silicon nitride film is formed.

When the NH$_3$ gas is plasma-excited and is supplied as active species, the APC valve 244 is properly adjusted such that the internal pressure of the processing chamber 201 falls within a range of, e.g., from 10 Pa to 100 Pa. The supply flow rate of the NH$_3$ gas controlled by the mass flow controller 241b is set to fall within a range of, e.g., from 1000 sccm to 10000 sccm. The exposure time of the wafers 200 to the active species obtained by plasma-exciting the NH$_3$ gas, namely the gas supply time (irradiation time), is set to fall within a range of, e.g., from 2 seconds to 120 seconds. At this time, as in step S205, the temperature of the heater 207 is set such that the temperature of the wafers 200 remains lower than 600 degrees C. and, preferably, falls within a range of, e.g., from 300 degrees C. to 600 degrees C. Furthermore, the high-frequency power applied from the high-frequency power supply 273 to between the first rod-shaped electrode 269 and the second rod-shaped electrode 270 is set to fall within a range of, e.g., from 50 W to 1000 W. Since the NH$_3$ gas has a high reaction temperature, it is not likely to react at the aforementioned wafer temperature and at the aforementioned internal pressure of the processing chamber 201. Thus, the NH$_3$ gas is plasma-excited to the active species and then supplied. For that reason, the temperature of the wafers 200 may be kept in the low temperature range set as above. Alternatively, when supplying the NH$_3$ gas, it is also possible to thermally activate the NH$_3$ gas, rather than plasma-excitation, by properly regulating the temperature of the heater 207 such that the temperature of the wafers 200 becomes equal to or higher than, e.g., 600 degrees C. and also appropriately adjusting the APC valve 244 such that the internal pressure of the processing chamber 201 falls within a range of, e.g., from 50 Pa to 3000 Pa. If the NH$_3$ gas is supplied in a thermally activated state, it is possible to generate a soft reaction.

<Step S208>

In step S208, the valve 243b of the second gas supply pipe 232b is closed to stop the supply of the NH$_3$ gas. At this time, the APC valve 244 of the exhaust pipe 231 is kept opened and the inside of the processing chamber 201 is vacuum-exhausted by the vacuum pump 246, whereby the unreacted NH$_3$ gas or the NH$_3$ gas after the contribution to the nitridation, which remains within the processing chamber 201, is removed from the inside of the processing chamber 201. At this time, the valves 243d and 247b are kept opened and the supply of the N$_2$ gas into the processing chamber 201 is maintained. This enhances the removal of the unreacted NH$_3$ gas or the NH$_3$ gas after the contribution to the nitridation, which remains within the processing chamber 201, from the inside of the processing chamber 201.

At this time, the gas remaining within the processing chamber 201 may not be completely removed and the inside of the processing chamber 201 may not be completely purged. If a small amount of gas remains within the processing chamber 201, the gas does not adversely affect the step to be performed thereafter. At this time, the flow rate of the N$_2$ gas to be supplied into the processing chamber 201 does not need to be large. For example, when the N$_2$ gas is supplied in a quantity comparable to the volume of the reaction tube 203 (the processing chamber 201), it is possible to perform the purge to such a level as not to adversely affect the subsequent step. In case of not completely purging the inside of the processing chamber 201, it is possible to shorten the purge time and to increase the throughput. It is also possible to limit the consumption of the N$_2$ gas to a necessary minimum level.

As the nitrogen-containing gas, it may be possible to use not only the gas obtained by plasma-exciting or thermally activating the NH$_3$ gas, but also the gas obtained by plasma-exciting or thermally activating a N$_2$ gas, a NF$_3$ gas, a N$_3$H$_8$ gas or the like. It may also be possible to use the gas which is obtained by plasma-exciting or thermally activating the aforementioned gas and diluted with a rare gas such as an Ar gas, a He gas, a Ne gas, a Xe gas or the like.

By executing a cycle including steps S205 to S208 at least once (step S210), a silicon nitride film having a predetermined film thickness and containing silicon (a first element) and nitrogen (a second element) may be formed on each of the wafers 200. It is preferred that the aforementioned cycle is repeated multiple times.

After the film-forming process for forming the silicon nitride film having a predetermined film thickness, an inert gas such as a N$_2$ gas or the like is supplied into the processing chamber 201 and is exhausted from the exhaust pipe 231, whereby the inside of the processing chamber 201 is purged with the inert gas (gas purging) (step S211). Thereafter, the internal atmosphere of the processing chamber 201 is substituted by the inert gas (inert gas substitution) and the internal pressure of the processing chamber 201 is returned to a normal pressure (returning to atmospheric pressure) (step S212).

Thereafter, the seal cap 219 is lowered down by the boat elevator 115 to open the lower end portion of the manifold 209. The processed wafers 200 supported on the boat 217 are carried out of the reaction tube 203 through the lower end portion of the manifold 209 (boat unloading) (step S213). Subsequently, the processed wafers 200 are discharged from the boat 217 (wafer discharging) (step S214).

In this way, the silicon nitride film can be formed on the surface of each of the wafers 200 using the DCS gas and the NH$_3$ gas.

The etching method according to some embodiments of the present disclosure can be suitably applied to not only the case where the DCS gas and the $NH_3$ gas are used as source gases when forming the silicon nitride film, but also where a hexachlorodisilane ($Si_2Cl_6$) gas and a $NH_3$ gas are used as source gases and other cases where other Si precursors and other nitriding precursors are used as source gases. The etching method according to some embodiments of the present disclosure can be suitably applied to not only the case where the silicon nitride film is formed by alternately supplying the Si precursor and the nitriding precursor, but also a case where a silicon nitride film is formed through a CVD method by simultaneously supplying the Si precursor and the nitriding precursor.

Next, the gas cleaning of the processing furnace 202 will be described, according to some embodiments of the present disclosure.

(First Embodiment of Gas Cleaning)

Gas cleaning is implemented at or around the temperature of the boat unloading. For instance, if the temperature during the boat unloading is set at 300 degrees C., the gas cleaning is also implemented at or around 300 degrees C. This makes it possible to reduce the time otherwise required in changing the temperature, thereby shortening the process time. Alternatively, the gas cleaning may be implemented by arbitrarily changing the temperature and changing the etching conditions.

In the gas cleaning, a $NF_3$ gas is used as a cleaning gas. The cleaning gas may be supplied from a $NH_3$ gas port. However, since the $NH_3$ gas port is installed in an area where the plasma intensity is relatively stronger than the Si source port, it is preferred that the cleaning gas is supplied from the Si source port to suppress damage of a quartz reaction tube.

It is presumed that, during the gas cleaning, the cleaning gas is excited due to the movement (delivery) of the exciting energy from the excited $N_2$ species supplied from the $NH_3$ gas port to the cleaning gas, or the cleaning gas or the $N_2$ gas diffused to the vicinity of the $NH_3$ gas port is excited by high-frequency waves, whereby cleaning occurs.

Figure 6:
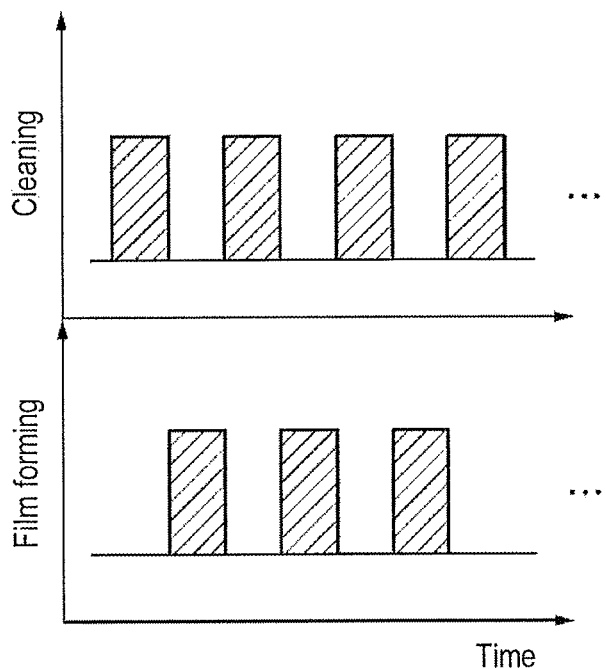
FIG. 6 is a timing chart showing a film-forming process and a gas etching process according to a first embodiment of the present disclosure.
Figure 7:
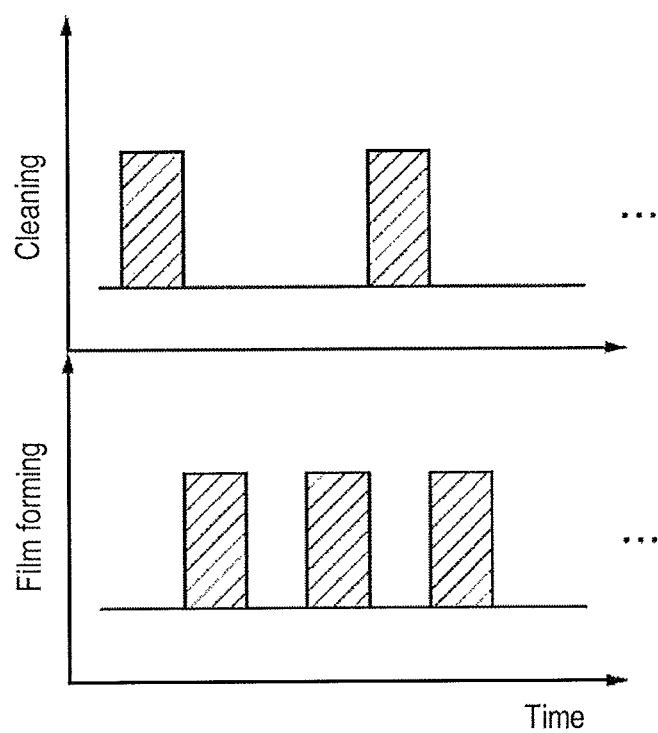
FIG. 7 is another timing chart showing a film-forming process and a gas etching process according to the first embodiment of the present disclosure.

In FIG. 6, an example where the gas cleaning is implemented at the end of every film-forming process is illustrated. In FIG. 7, an example is illustrated where the gas cleaning is implemented each time after the film-forming process is performed a certain multiple number of times (twice in this example).

Next, the gas cleaning of the processing furnace 202 will be described with reference to FIGS. 1 and 2.

If the film-forming process is finished, the boat 217 that holds the wafers 200 is taken out from the processing chamber 201 by the boat elevator 115. The wafers 200 are unloaded from the boat 217.

In the meantime, the inside of the processing chamber 201 is maintained at, e.g., 300 degrees C., by controlling the heater 207.

The boat 217 that does not hold the wafers 200 is elevated by the boat elevator 115 and is carried into the processing chamber 201. In this state, the seal cap 219 seals the lower end portion of the manifold 209 through the O-ring 220.

Thereafter, the internal temperature of the processing chamber 201 is maintained at 300 degrees C. and the valves 247b, 251a, 256a and 256b are closed. In this state, the APC valve 244 is opened and the inside of the processing chamber 201 is vacuum-exhausted.

After the internal pressure of the processing chamber 201 reaches a predetermined vacuum degree, the valve 256a is opened. By adjusting the opening degree of the APC valve 244 while supplying a $NF_3$ gas into the processing chamber 201, the inside of the processing chamber 201 is maintained at a predetermined pressure (see FIG. 8).

Thereafter, high-frequency power is applied from the high-frequency power supply 273 to between the rod-shaped electrodes 269 and 270, thereby generating plasma. As such, the $NF_3$ gas is first supplied into the processing chamber 201 and then the plasma is generated. This makes it possible to perform plasma excitation with the inside of the processing chamber 201 being stabilized.

Thereafter, the supply of the high-frequency power from the high-frequency power supply 273 is stopped. The valve 256a is closed to stop the supply of the $NF_3$ gas to the processing chamber 201. The APC valve 244 is opened and the inside of the processing chamber 201 is vacuum-exhausted. During the series of operations mentioned above, the internal temperature of the processing chamber 201 is kept at 300 degrees C.

Thereafter, the boat 217 not holding the wafers 200 is taken out from the processing chamber 201 by the boat elevator 115. New wafers 200 are charged to the boat 217. The boat 217 holding the wafers 200 is carried into the processing chamber 201 by the boat elevator 115. A film is formed on each of the wafers 200.

Figure 8:
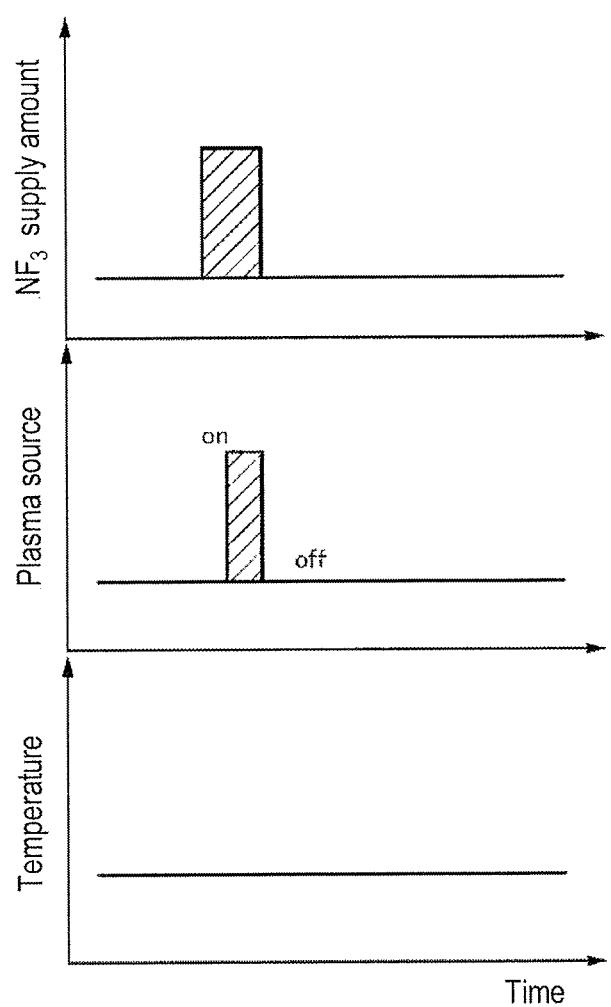
FIG. 8 is another timing chart showing a gas etching process according to the first embodiment of the present disclosure.
Figure 9:
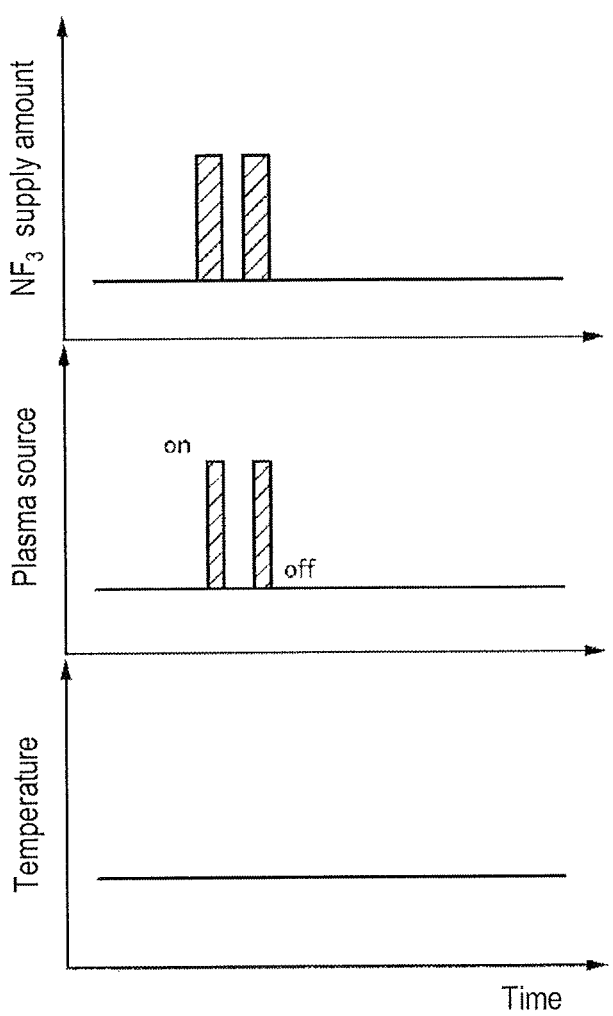
FIG. 9 is yet another timing chart showing a gas etching process according to the first embodiment of the present disclosure.
Figure 10:
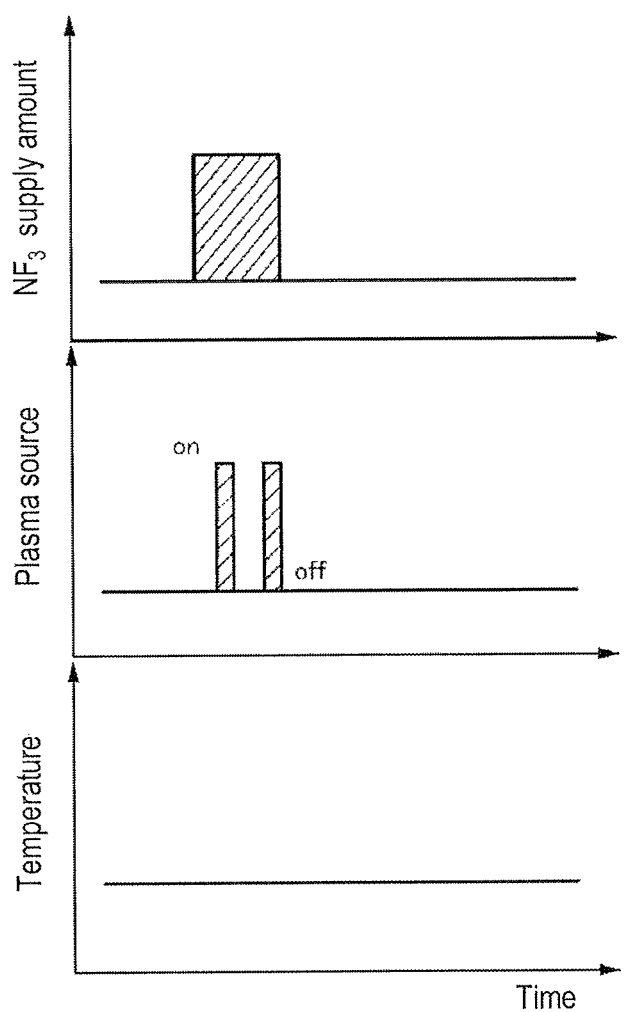
FIG. 10 is yet another timing chart showing a gas etching process in the first embodiment of the present disclosure.

As shown in FIG. 8, gas cleaning may be implemented by continuous $NF_3$ plasma. As shown in FIG. 9, gas cleaning may be implemented by intermittently supplying an $NF_3$ gas and intermittently turning plasma on and off in keeping with the supply of the $NF_3$ gas. As shown in FIG. 10, gas cleaning may be implemented by continuously supplying an $NF_3$ gas and intermittently turning plasma on and off.

Prior to turning $NF_3$ plasma on, the valves 243c, 247a and 251a may be opened to supply only the $N_2$ gas. High-frequency power may be applied from the high-frequency power supply 273 to between the rod-shaped electrodes 269 and 270, thereby turning $N_2$ plasma on. Thereafter, the supply of the high-frequency power from the high-frequency power supply 273 may be stopped. The valves 243c, 247a and 251a are closed to stop generation of the $N_2$ plasma. Thereafter, the valve 256a is opened to supply a $NF_3$ gas, thereby turning $NF_3$ plasma on. By doing so, the reproducibility of $NF_3$ plasma (cleaning) is stabilized. Presumably, this is because, if the region where the state such as an electrode temperature or the like undergoes a change during the on-period of plasma is preliminarily treated with $N_2$ plasma, it becomes possible to obtain an effect of removing the heat generated by a cleaning reaction and reducing the change amount of the state during the on-period of $NF_3$ plasma.

In order to improve etching at a hard-to-etch location such as the back of the Si precursor supply nozzle 249a or the temperature-control-purpose temperature sensor 263, circumferential supply holes as well as the holes oriented toward the wafers 200 may be formed in the port (nozzle) for supplying the gas excited by plasma. By doing so, the amount of excited species supplied to the furnace wall is increased and therefore the cleaning efficiency is improved. In this case, it is necessary to optimize apportioning between the cleaning (the circumferential supply holes) and the film-forming (the holes oriented toward the wafers).

(Second Embodiment of Gas Cleaning)

Figure 11:
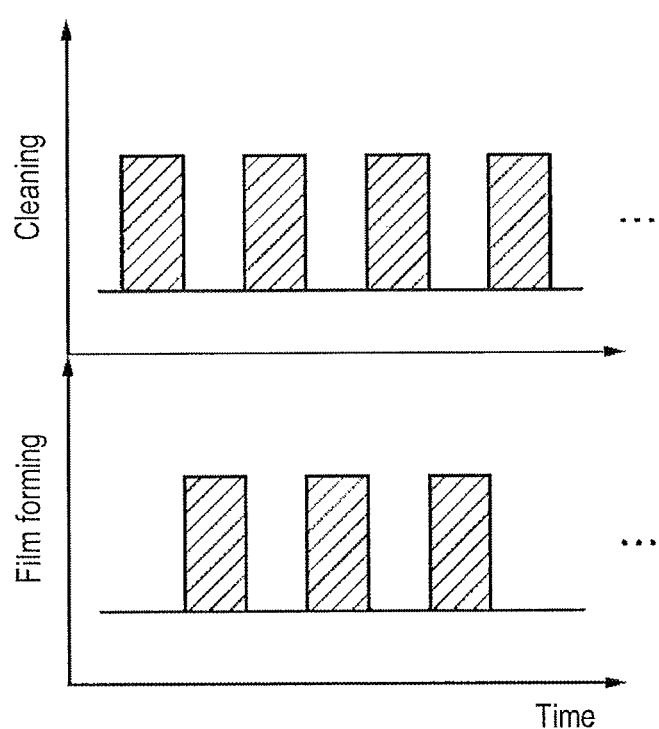
FIG. 11 is a timing chart showing a film-forming process and a gas etching process according to a second embodiment of the present disclosure.

As shown in FIG. 11, for example, gas cleaning may be implemented at the end of every film-forming process. Alternatively, gas cleaning may be implemented each time after the film-forming process is performed a certain multiple number of times.

Figure 12:
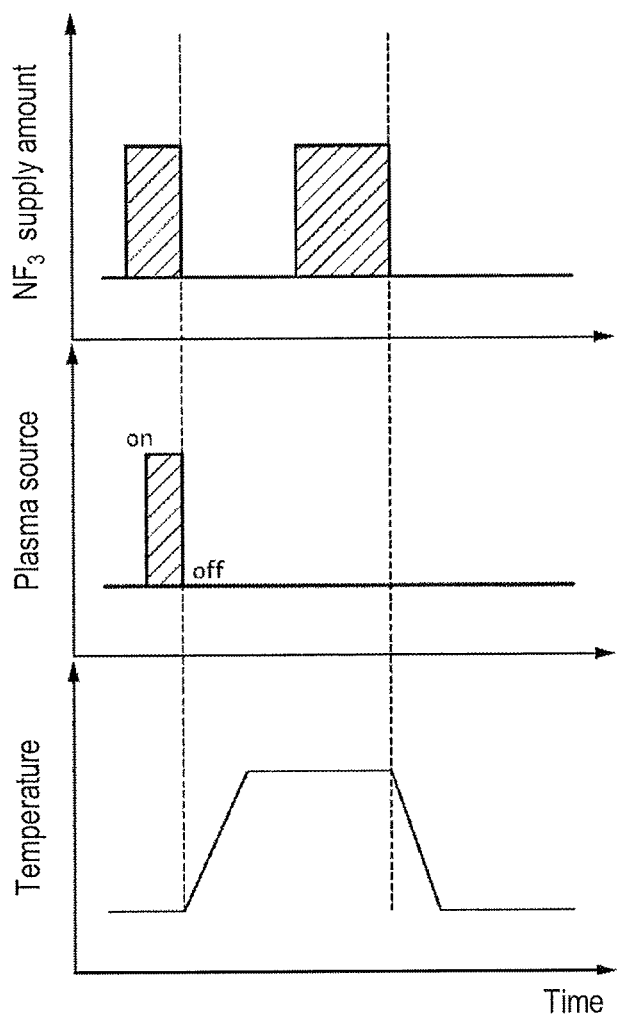
FIG. 12 is another timing chart showing a gas etching process according to the second embodiment of the present disclosure.

As shown in FIG. 12, gas cleaning may be implemented by using reactive species obtained by plasma-exciting the NF$_3$ gas at a first temperature, e.g., 300 degrees C., and then using reactive species thermally excited, rather than plasma-excitation, at a second temperature higher than the first temperature, e.g., 600 degrees C. to 650 degrees C.

Figure 13:
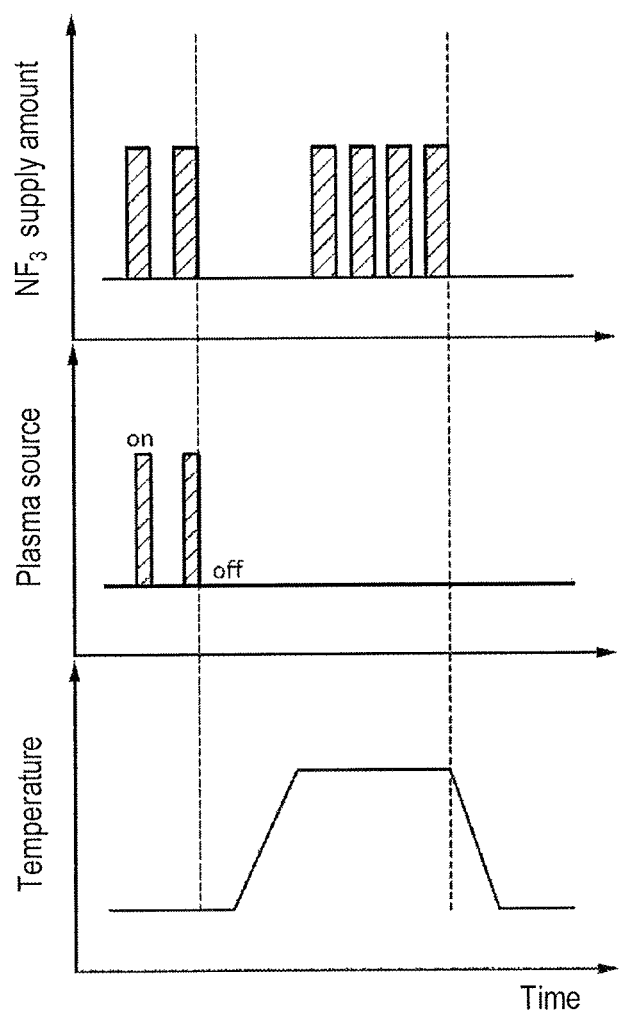
FIG. 13 is yet another timing chart showing a gas etching process according to the second embodiment of the present disclosure.

Gas cleaning may be implemented by continuously supplying NF$_3$ plasma (see FIG. 12) or may be implemented by intermittently turning the plasma on and off (see FIG. 13). In this case, as shown in FIG. 13, gas cleaning may be implemented by intermittently supplying the NF$_3$ gas and intermittently turning the plasma on and off in keeping with the supply of the NF$_3$ gas. Alternatively, gas cleaning may be implemented by continuously supplying an NF$_3$ gas and intermittently turning plasma on and off. Even in the case where gas cleaning is implemented at the second temperature using reactive species thermally excited rather than plasma-excitation, the NF$_3$ gas may be continuously supplied as shown in FIG. 12 or may be intermittently supplied as shown in FIG. 13.

In addition, when gas cleaning is implemented at the second temperature, plasma generation also may be used together so that gaseous species are excited by both heat and plasma.

Gas cleaning is implemented in order to suppress the generation of foreign substances caused by accumulation of the cumulative film and to reduce the resultant maintenance frequency. Thus, the cumulative film may be wholly or partially cleaned away.

(Third Embodiment of Gas Cleaning)

Figure 14:
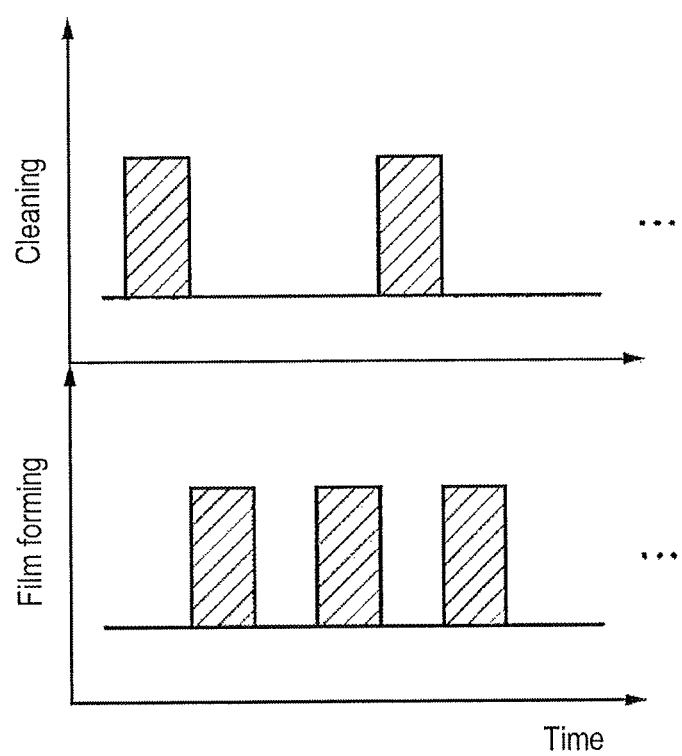
FIG. 14 is a timing chart showing a film-forming process and a gas etching process according to a third embodiment of the present disclosure.

FIG. 14 shows an example where gas cleaning is implemented after the film-forming process is performed a certain multiple number of times. Alternatively, gas cleaning may be implemented every end of the film-forming process.

Figure 15:
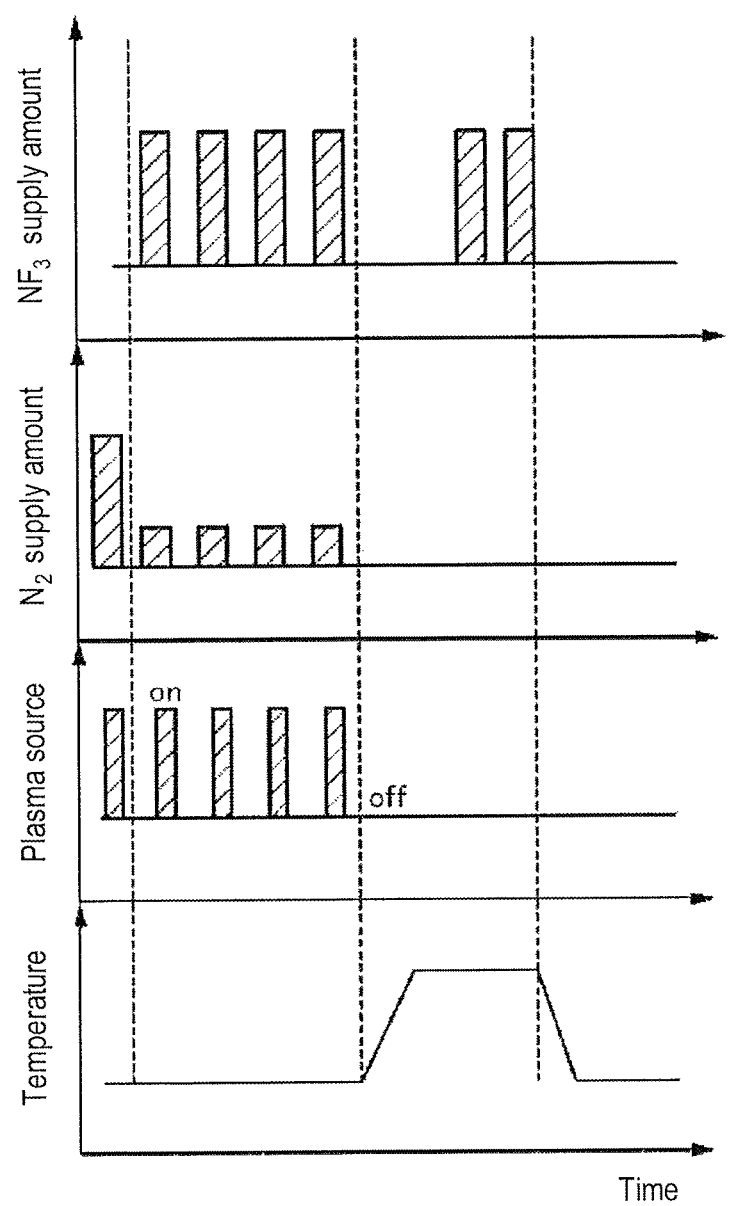
FIG. 15 is another timing chart showing a gas etching process according to the third embodiment of the present disclosure.

The gas cleaning of the third embodiment differs from the gas cleaning of the second embodiment in that, prior to supplying the NF$_3$ gas, plasma is generated at the first temperature only by a N$_2$ gas (see FIG. 15). As the gas cleaning of the second embodiment, plasma may be generated during the supply of a NF$_3$ gas. However, if the N$_2$ plasma generation (preliminary treatment) is performed immediately before the generation of NF$_3$ plasma, it is possible to remove the heat generated by a cleaning reaction and to reduce the state change amount during the application of plasma to the NF$_3$ gas. Thus, the plasma generation during the supply of the NF$_3$ gas is easily stabilized. Moreover, the purge effect can be enhanced by the N$_2$ plasma generation performed immediately before the generation of NF$_3$ plasma. This makes it possible to rapidly perform the purge.

When gas cleaning is implemented by the NF$_3$ plasma at the first temperature, the NF$_3$ gas is intermittently supplied and the plasma is intermittently turned on and off in keeping with the supply of the NF$_3$ gas. However, the plasma may be intermittently turned on and off while continuously supplying the NF$_3$ gas. The N$_2$ gas may be also intermittently supplied in keeping with the intermittent supply of the NF$_3$ gas so that N$_2$ plasma is also intermittently generated when intermittently generating the NF$_3$ plasma. At this time, the amount of the N$_2$ gas is smaller than that available when plasma is generated only by the N$_2$ gas prior to the supply of the NF$_3$ gas.

The plasma source adaptation effect in case that the in-furnace state is adapted by the generation of N$_2$ plasma may be considered. In addition to the N$_2$ plasma, a small amount of NF$_3$ gas may be simultaneously supplied. This may be also implemented in case where plasma generation is also performed at the second temperature higher than the first temperature.

While the NF$_3$ gas is intermittently supplied in case where gas cleaning is implemented at the second temperature higher than the first temperature using reactive species excited by heat rather than plasma, it may be possible to continuously supply the NF$_3$ gas.

(Fourth Embodiment of Gas Cleaning)

Figure 16:
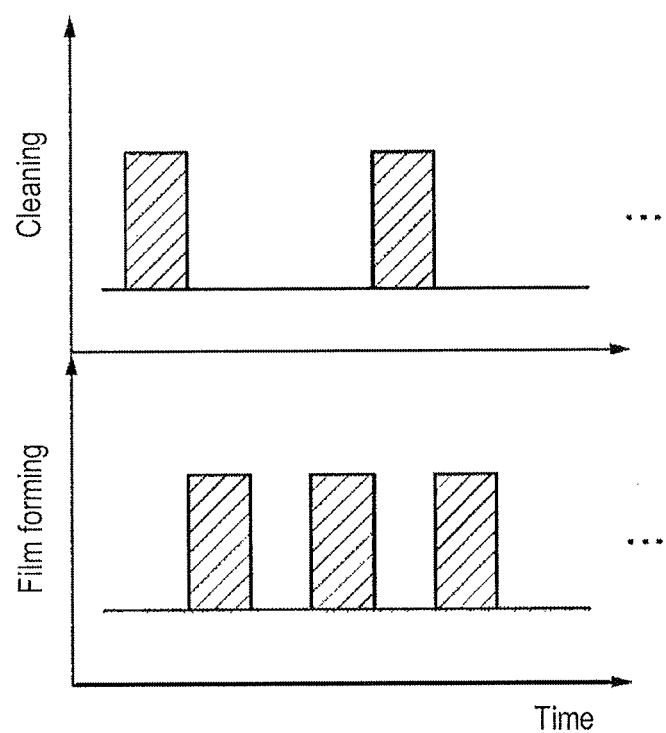
FIG. 16 is a timing chart showing a film-forming process and a gas etching process according to a fourth embodiment of the present disclosure.

FIG. 16 shows an example where gas cleaning is implemented after the film-forming process is performed a certain multiple number of times. Alternatively, gas cleaning may be implemented at the end of every film-forming process.

Figure 17:
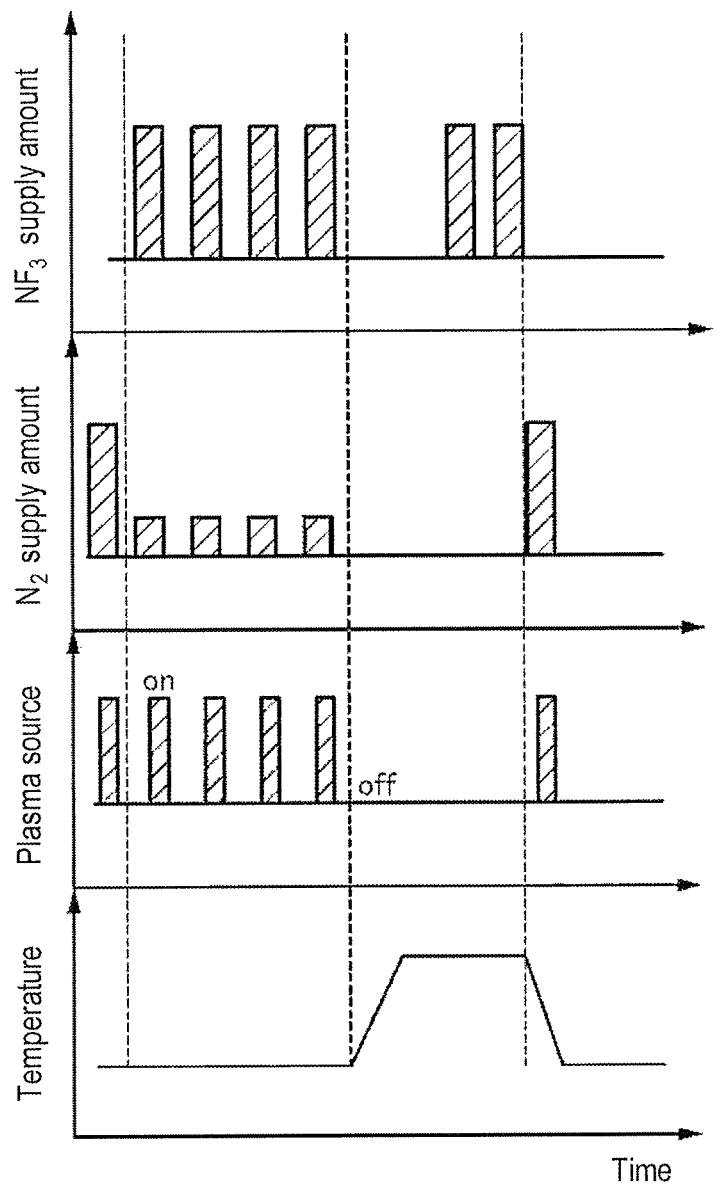
FIG. 17 is another timing chart showing a gas etching process according to the fourth embodiment of the present disclosure.

The gas cleaning of the fourth embodiment differs from the gas cleaning of the third embodiment in that plasma is generated only with a N$_2$ gas even after the gas cleaning is implemented at the second temperature higher than the first temperature using reactive species of the NF$_3$ gas excited by heat rather than plasma (see FIG. 17).

The efficiency of a step (purge step) for accelerating the discharge of the NF$_3$ gas that, for example, is piled up, is adsorbed, and remains within the furnace is improved by the N$_2$ plasma generated after the supply of the NF$_3$ gas.

(Fifth Embodiment of Gas Cleaning)

Figure 18:
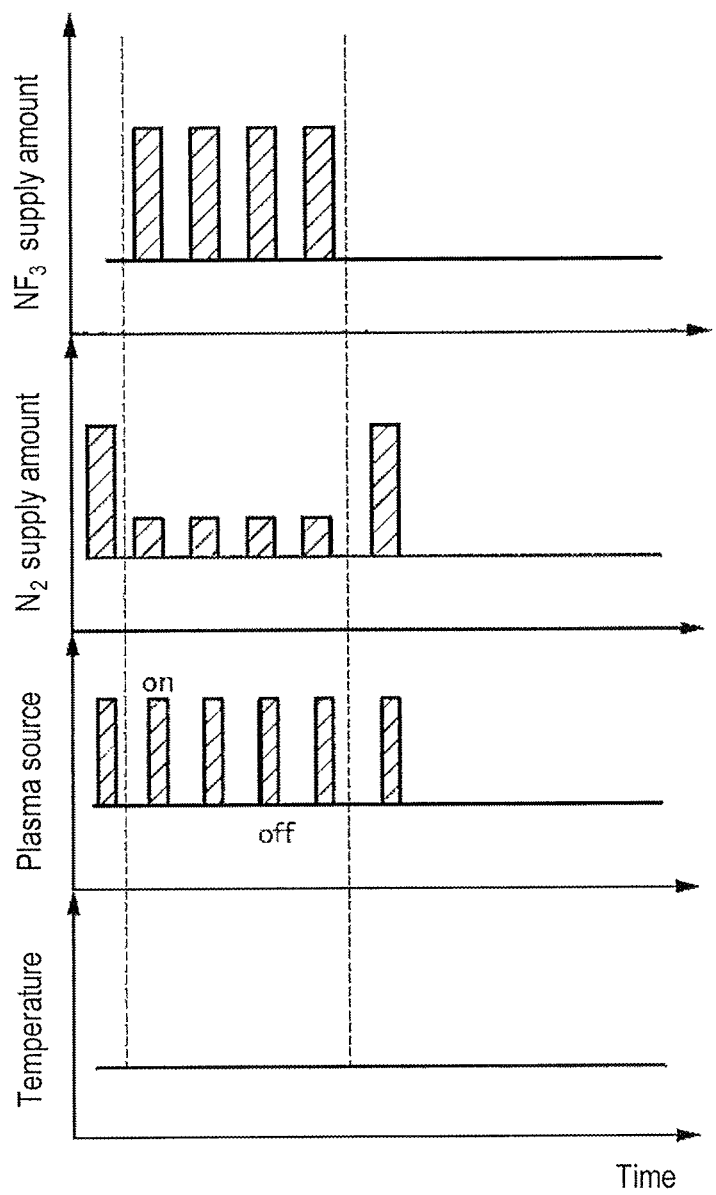
FIG. 18 is a timing chart showing a gas etching process according to a fifth embodiment of the present disclosure.

The gas cleaning of the fifth embodiment differs from the gas cleaning of the fourth embodiment in that only the gas cleaning using NF$_3$ plasma is implemented at the first temperature, instead of implementing the gas cleaning at the second temperature higher than the first temperature, using reactive species of the NF$_3$ gas excited by heat rather than plasma (see FIG. 18). Plasma is generated using only the N$_2$ gas before and after implementing the gas cleaning at the first temperature using NF$_3$ plasma.

The plasma generation during the supply of the NF$_3$ gas is easily stabilized by the N$_2$ plasma generated before implementing the gas cleaning using the NF$_3$ plasma. The discharge of the NF$_3$ gas that, for example, is piled up, is adsorbed, and remains within the furnace is accelerated by the N$_2$ plasma generated after implementing the gas cleaning using the NF$_3$ plasma. While the plasma generation accompanied by the supply of the NF$_3$ gas and the N$_2$ plasma generation are shown independent of each other, the NF$_3$ gas may be reduced stepwise during the plasma generation accompanied by the supply of the NF$_3$ gas.

(Sixth Embodiment of Gas Cleaning)

The gas cleaning of the sixth embodiment differs from the gas cleaning of the first to fifth embodiments in that a silicon nitride film is formed by using SiH$_2$Cl$_2$ as a first film-forming gas and using NH$_3$ as a second film-forming gas, a silicon oxide film is formed by using tris(dimethylamino)silane as a third film-forming gas and using oxygen as a fourth film-forming gas, a film (ONO film) is formed by arbitrarily combining the silicon nitride film and the silicon oxide film, and gas cleaning is implemented after the film-forming process is performed a certain multiple number of times or every end of the film-forming process.

Figure 19:
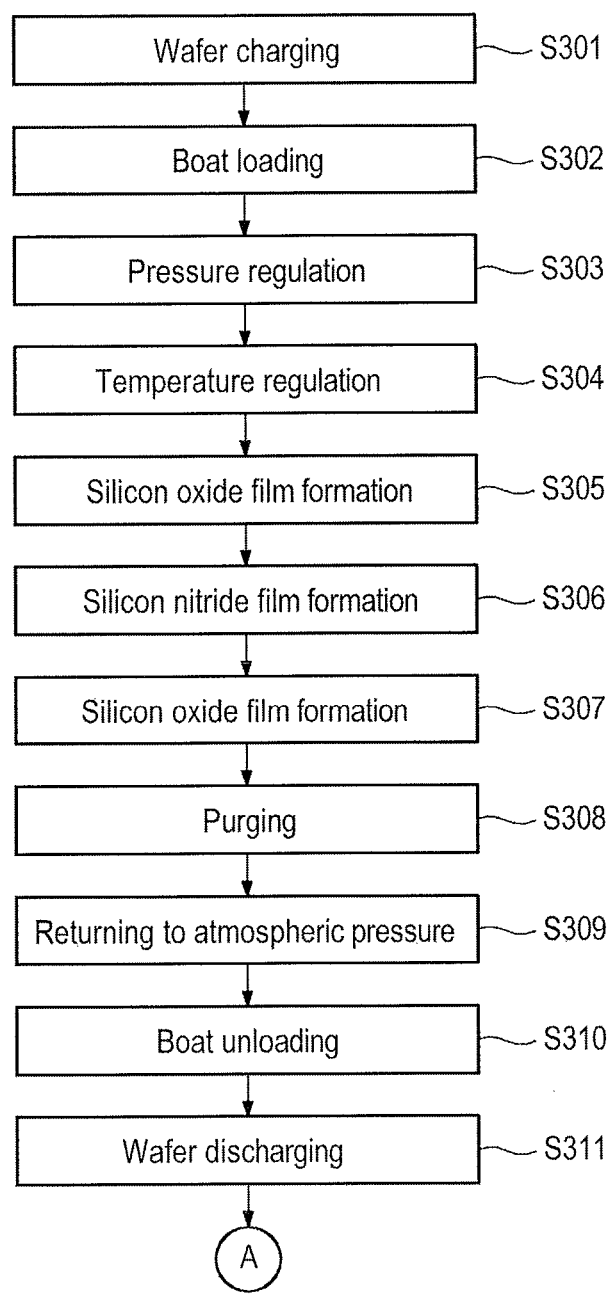
FIG. 19 is a flowchart showing a film-forming process and a gas cleaning process according to a sixth embodiment of the present disclosure.
Figure 20:
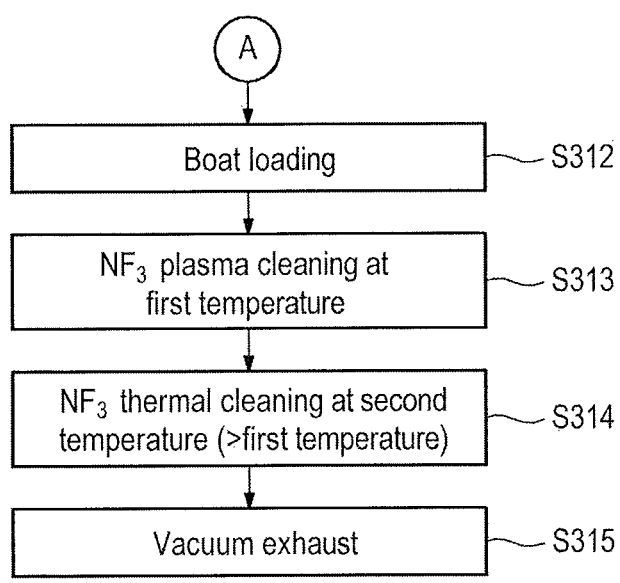
FIG. 20 is another flowchart showing a film-forming process and a gas cleaning process according to the sixth embodiment of the present disclosure.

A film-forming method and an etching method according to the present embodiment will now be described with reference to FIGS. 19 and 20. In the present sixth embodiment, a substrate processing device is utilized that is configured by adding a third gas supply system (not shown) and a fourth gas supply system (not shown) to the substrate processing device described with reference to FIGS. 1 to 3.

First, if a plurality of wafers 200 is charged to the boat 217 (wafer charging) (step S301), as shown in FIG. 1, the boat 217 that supports the wafers 200 is elevated up by the boat elevator 115 and is carried into the processing chamber 201 (boat loading) (step S302).

The inside of the processing chamber 201 is vacuum-exhausted by the vacuum pump 246 such that the internal pressure of the processing chamber 201 becomes a desired pressure (vacuum degree). At this time, the internal pressure of the processing chamber 201 is measured by the pressure sensor 245. Based on the pressure thus measured, the APC valve 244 is feedback controlled (pressure regulation) (step S303). Furthermore, the inside of the processing chamber 201 is heated by the heater 207 such that the internal temperature of the processing chamber 201 becomes a desired temperature. At this time, based on the temperature information detected by the temperature sensor 263, the supply of electric power to the heater 207 is feedback controlled (temperature regulation) (step S304). Subsequently, the boat 217 is rotated by the rotary mechanism 267, whereby the wafers 200 are rotated.

Then, one cycle that includes a step of supplying a tris(dimethylamino)silane gas from a third gas supply system (not shown) into the processing chamber 201, a step of exhausting the inside of the processing chamber 201, a step of supplying an oxygen gas from a fourth gas supply system (not shown) into the processing chamber 201 and a step of exhausting the inside of the processing chamber 201 is carried out once or more to form a silicon oxide film (step S305). It is preferred that this cycle is carried out multiple times.

Then, one cycle that includes a step of supplying a $SiH_2Cl_2$ gas from the first gas supply pipe 232a into the processing chamber 201, a step of exhausting the inside of the processing chamber 201, a step of supplying a $NH_3$ gas from the second gas supply pipe 232b into the buffer chamber 237, a step of plasma-exciting the $NH_3$ gas by applying high-frequency power from the high-frequency power supply 273 to between the first rod-shaped electrode 269 and the second rod-shaped electrode 270 through the matcher 272 and a step of exhausting the inside of the processing chamber 201 is carried out once or more to form a silicon nitride film (step S306). It is preferred that this cycle is carried out multiple times.

Then, one cycle that includes a step of supplying a tris(dimethylamino)silane gas from a third gas supply system (not shown) into the processing chamber 201, a step of exhausting the inside of the processing chamber 201, a step of supplying an oxygen gas from a fourth gas supply system (not shown) into the processing chamber 201 and a step of exhausting the inside of the processing chamber 201 is carried out once or more to form a silicon oxide film (step S307). It is preferred that this cycle is carried out multiple times.

If a film-forming process for forming a laminated film (ONO film) of silicon oxide film-silicon nitride film-silicon oxide film having a predetermined film thickness is carried out in this manner, an inert gas such as a $N_2$ gas or the like is supplied into the processing chamber 201 and is exhausted, whereby the inside of the processing chamber 201 is purged with the inert gas (purging) (step S308). Thereafter, the internal atmosphere of the processing chamber 201 is substituted by the inert gas (inert gas substitution) and the internal pressure of the processing chamber 201 is returned to a normal pressure (returning to atmospheric pressure) (step S309).

Thereafter, the seal cap 219 is moved down by the boat elevator. The processed wafers 200 supported on the boat 217 are carried out of the reaction tube 203 through the lower end portion of the manifold 209 (boat unloading) (step S310). Subsequently, the processed wafers 200 are discharged from the boat 217 (wafer discharging) (step S311).

In this way, an ONO film can be formed by forming the silicon oxide film on the surface of each of the wafers 200 using the tris(dimethylamino)silane gas and the oxygen gas and by forming the silicon nitride film on the surface of each of the wafers 200 using the DCS ($SiH_2Cl_2$) gas and the $NH_3$ gas.

The etching method according to the present embodiment can be suitably applied to not only the case where the DCS gas and the $NH_3$ gas are used as source gases when forming the silicon nitride film, but also where a hexachlorodisilane ($Si_2Cl_6$) gas and a $NH_3$ gas are used as source gases and a case where other Si precursors and other nitriding precursors are used as source gases. The etching method according to the present embodiment can be suitably applied to not only the case where the silicon nitride film is formed by alternately supplying the Si precursor and the nitriding precursor, but also a case where a silicon nitride film is formed through the CVD method by simultaneously supplying the Si precursor and the nitriding precursor. The etching method according to the present embodiment can be suitably applied to not only the case where the tris(dimethylamino)silane gas and the oxygen gas are used as source gases when forming the silicon oxide film, but also a case where an organic Si source other than tris(dimethylamino)silane and ozone are used as source gases and a case where other Si precursors and other oxidizing precursors are used as source gases. The etching method according to the present embodiment can be suitably applied to not only the case where silicon oxide film is formed by alternately supplying the Si precursor and the oxidizing precursor, but also a case where a silicon oxide film is formed through the CVD by simultaneously supplying the Si precursor and the oxidizing precursor.

Next, description will be made on the gas cleaning of the processing furnace 202 according to the present embodiment.

The gas cleaning is implemented in the same manner as the gas cleaning of the first to fifth embodiments. In the gas cleaning using only the thermally-activated $NF_3$ gas without using plasma excitation, the silicon nitride film is etched but the silicon oxide film is not etched. By plasma-exciting the $NF_3$ gas, it becomes possible to apply the gas cleaning to the ONO film.

The gas cleaning is implemented around the temperature during the boat unloading. For instance, if the temperature during the boat unloading is set at 300 degrees C., the gas cleaning may be also implemented at or around 300 degrees C. This makes it possible to reduce the time otherwise required in changing the temperature and to shorten the process time. Alternatively, the gas cleaning may be implemented by arbitrarily changing the temperature and changing the etching conditions. In the gas cleaning, a $NF_3$ gas is used as a cleaning gas.

If the film-forming process is finished, the boat 217 that holds the wafers 200 is taken out from the processing chamber 201 by the boat elevator 115. The wafers 200 are unloaded from the boat 217.

In the meantime, the inside of the processing chamber 201 is maintained at, e.g., 300 degrees C., by controlling the heater 207.

The boat 217 that does not hold the wafers 200 is elevated up by the boat elevator 115 and is carried into the processing chamber 201 (boat loading) (step S312). In this state, the seal cap 219 seals the lower end portion of the manifold 209 through the O-ring 220.

Thereafter, the internal temperature of the processing chamber 201 is maintained at, e.g., 300 degrees C., and the inside of the processing chamber 201 is vacuum-exhausted.

After the internal pressure of the processing chamber 201 reaches a predetermined vacuum degree, the opening degree of the APC valve 244 is adjusted while supplying a $NF_3$ gas from the first gas supply system and the third gas supply system into the processing chamber 201, whereby the inside of the processing chamber 201 is maintained at a predetermined pressure.

Thereafter, high-frequency power is applied from the high-frequency power supply 273 to between the rod-shaped electrodes 269 and 270, thereby generating plasma. Plasma cleaning (first cleaning) is implemented using reactive species obtained by plasma-exciting the $NF_3$ gas (step S313).

Thereafter, gas cleaning (second cleaning) is implemented at the second temperature higher than the first temperature, e.g., 600 degrees C. to 650 degrees C., using reactive species excited by heat rather than plasma (step S314).

Thereafter, the inside of the processing chamber 201 is vacuum-exhausted (step S315). Then, the inside of the processing chamber 201 is maintained at the atmospheric pressure. Subsequently, the boat 217 not holding the wafers 200 is taken out from the processing chamber 201 by the boat elevator 115. New wafers 200 are charged to the boat 217. The boat 217 holding the wafers 200 is carried into the processing chamber 201 by the boat elevator 115. A film is formed on each of the wafers 200.

Gas cleaning may be implemented by continuous $NF_3$ plasma (see FIG. 12) or may be implemented by intermittently turning plasma on and off (see FIG. 13). In this case, as shown in FIG. 13, gas cleaning may be implemented by intermittently supplying an $NF_3$ gas and intermittently turning plasma on and off in keeping with the supply of the $NF_3$ gas. Alternatively, gas cleaning may be implemented by continuously supplying an $NF_3$ gas and intermittently turning plasma on and off. Even in the case where gas cleaning is implemented at the second temperature using reactive species excited by heat rather than plasma, the $NF_3$ gas may be continuously supplied as shown in FIG. 12 or may be intermittently supplied as shown in FIG. 13.

As shown in FIG. 14, the gas cleaning may be implemented after the formation of an ONO film is performed a certain multiple number of times. Alternatively, the gas cleaning may be implemented the end of every film-forming process.

As shown in FIG. 15, prior to supplying a $NF_3$ gas, plasma may be generated at the first temperature only by a $N_2$ gas. If the $N_2$ plasma generation (preliminary treatment) is performed immediately before the generation of $NF_3$ plasma, it is possible to remove the heat generated by a cleaning reaction and to reduce the state change amount during the application of plasma to the $NF_3$ gas. Thus, the plasma generation during the supply of the $NF_3$ gas is easily stabilized. Moreover, the purge effect can be enhanced by the $N_2$ plasma generation performed immediately before the generation of $NF_3$ plasma. This makes it possible to rapidly perform the purge.

When gas cleaning is implemented by the $NF_3$ plasma at the first temperature, the $NF_3$ gas may be intermittently supplied and the plasma may be intermittently turned on and off in keeping with the supply of the $NF_3$ gas. The plasma may be intermittently turned on and off while continuously supplying the $NF_3$ gas. The $N_2$ gas may also be intermittently supplied in keeping with the intermittent supply of the $NF_3$ gas. Thus, $N_2$ plasma may also be intermittently generated when intermittently generating the $NF_3$ plasma.

The plasma source adaptation effect in case that the in-furnace state is adapted by the generation of $N_2$ plasma may be considered. In addition to the $N_2$ plasma, a small amount of $NF_3$ gas may be simultaneously supplied. This may be also implemented in a case where plasma generation is also performed at the second temperature higher than the first temperature.

In a case where gas cleaning is implemented at the second temperature higher than the first temperature using reactive species excited by heat rather than plasma, it may be possible to intermittently or continuously supply the $NF_3$ gas.

As shown in FIG. 17, plasma may be generated with only the $N_2$ gas even after the gas cleaning is implemented at the second temperature higher than the first temperature using reactive species of an $NF_3$ gas excited by heat rather than plasma. The efficiency of a step (purge step) for accelerating the discharge of the $NF_3$ gas that is piled up, is adsorbed and remains within the furnace is improved by the $N_2$ plasma generated after the supply of the $NF_3$ gas.

Before and/or after a plasma-excited $NF_3$ gas is supplied into the processing chamber 201, an inert gas such as a plasma-excited $N_2$ gas or the like, or a plasma-excited ammonia (reactant gas), may be supplied into the processing chamber 201.

(Seventh Embodiment of Gas Cleaning)

The gas cleaning of the seventh embodiment differs from the gas cleaning of the first to fifth embodiments in that a silicon-rich silicon nitride film (SiRN or SRN film), which is higher in Si ratio than a $Si_3N_4$ gas, is formed using a $SiH_2Cl_2$ gas as a first film-forming gas and using a $NH_3$ gas as a second film-forming gas. As precursors for the formation of the silicon-rich silicon nitride film, it may be possible to use a $Si_2Cl_6$ gas and a $NH_3$ gas or to use other Si precursors and other nitriding precursors. In order to obtain the silicon nitride film higher in Si ratio than a $Si_3N_4$ gas, the film-forming temperature may be set at a temperature at which a silicon precursor is decomposed in a vapor phase, thereby allowing a silicon-containing film to be deposited on a substrate and eventually increasing the amount of silicon existing in the film. Alternatively, the supply conditions (supply amount, supply time, etc.) of a nitriding precursor may be changed to thereby reduce the amount of nitrogen existing in the film. Both the setting of the film-forming temperature and the changing of the supply conditions maybe be performed at the same time.

Gas cleaning is performed in the same manner as the gas cleaning of the first to fifth embodiments.

In the respective embodiments described above, the gas cleaning is implemented using the $NF_3$ gas. It is therefore possible to efficiently implement the gas cleaning of the silicon nitride film and to extend the period that requires the gas cleaning of the device for forming a silicon nitride film.

While the $NF_3$ gas is used as the cleaning gas in the respective embodiments described above, the present disclosure is not limited thereto. For example, it may be possible to use a halogen-containing gas such as a hydrogen fluoride (HF) gas, a chlorine trifluoride ($ClF_3$) gas or a fluorine ($F_2$) gas, which contains halogen such as fluorine (F) or chlorine (Cl).

When the gas cleaning is implemented by changing a temperature, the temperature may be gradually and continuously controlled while implementing the gas cleaning.

In the respective embodiments described above, a treatment step may be provided after the gas cleaning. In the treatment step, the attachments remaining within the processing chamber 201 are removed after the thin film etching step (the gas cleaning step), thereby smoothening the surface of a quartz member arranged within the processing chamber 201. That is to say, quartz cracks generated on the surface of the quartz member or attachments such as fine quartz particles (quartz powders) generated due to the quartz cracks and attached to the surface of the quartz member existing within the processing chamber 201 are removed. In the gas cleaning of the sixth embodiment, the treatment step may be implemented after the plasma cleaning (first cleaning) and the thermal cleaning (second cleaning) respectively.

The embodiments, modified examples and application examples described above may be used in proper combination. The present disclosure is not limited to the aforementioned embodiments but may be differently modified without departing from the spirit of the disclosure.

For example, in the aforementioned embodiments, description has been made on an example where a $SiH_2Cl_2$ gas and a tetrakis(dimethylamino)silane (TDMAS, $Si[N(CH_3)_2]_4$) gas are used as Si-containing precursor gases. However, the present disclosure is not limited thereto and may be applied to a metal film. For instance, it may be possible to use a titanium (Ti)-containing gas, such as a $TiCl_4$ gas or a tetrakis(diethylamino)titanium (TDEAT, $Ti[N(CH_2CH_3)_2]_4$) gas, which is an organic compound or an amino-based compound, other than a halogen compound.

As a metallic precursor gas which is a Ti-containing precursor, it may be possible to use, in addition to the $TiCl_4$ gas, a titanium (Ti)-containing gas, such as a tetrakis(dimethylamino)titanium (TDMAT, $Ti[N(CH_3)_2]_4$) gas or a tetrakis(diethylamino)titanium (TDEAT, $Ti[N(CH_2CH_3)_2]_4$) gas, which is an organic compound or an amino-based compound, other than a halogen compound.

In the present disclosure, the term "metal film" means a film composed of a conductive material which contains metal atoms. The metal film includes, in addition to the conductive elemental metal film composed of an elemental metal, a conductive metal nitride film, a conductive metal oxide film, a conductive metal oxynitride film, a conductive metal composite film, a conductive metal alloy film, a conductive metal silicide film, a conductive metal carbide film, a conductive metal carbonitride film, and so on. Furthermore, a TiCN film (titanium carbonitride film) is a conductive metal carbonitride film.

For example, in the aforementioned embodiments, description has been made on an example where a $NH_3$ gas is used as a nitriding precursor. However, the present disclosure is not limited thereto. It may be possible to use a diazene ($N_2H_2$) gas, a hydrazine ($N_2H_4$) gas, a $N_3H_8$ gas, a nitrogen ($N_2$) gas, a nitrous oxide ($N_2O$) gas, a monomethylhydrazine ($CH_6N_2$) gas, or a dimethylhydrazine ($C_2H_8N_2$) gas.

As the inert gas, it may be possible to use, in addition to the $N_2$ gas, a rare gas such as an Ar gas, a He gas, a Ne gas or a Xe gas.

As the metal precursor gas which is an Al-containing gas, it may be possible to use, in addition to the TMA gas, an $AlCl_3$ or the like.

The present disclosure may be suitably applied to the formation of a metal compound which contains one or more metal elements selected from a group consisting of tantalum (Ta), cobalt (Co), tungsten (W), molybdenum (Mo), ruthenium (Ru), yttrium (Y), lanthanum (La), zirconium (Zr) and hafnium (Hf). In this case, tantalum chloride ($TaCl_4$) or the like may be used as a Ta-containing precursor. Co amd[(tBu)NC($CH_3$)N(tBu)$_2$Co] or the like may be used as a Co-containing precursor. Tungsten fluoride ($WF_6$) or the like may be used as a W-containing precursor. Molybdenum chloride ($MoCl_3$ or $MoCl_5$) or the like may be used as a Mo-containing precursor. 2,4-dimethylpentadienyl(ethylcyclopentadienyl)ruthenium ((Ru(EtCp)($C_7H_{11}$)) or the like may be used as a Ru-containing precursor. Tris(ethylcyclopentadienyl) yttrium ($Y(C_2H_5C_5H_4)_3$) or the like may be used as an Y-containing precursor. Tris(isopropylcyclopentadienyl)lanthanum ($La(i-C_3H_7C_5H_4)_3$) or the like may be used as a La-containing precursor. Tetrakis(ethylmethylamino)zirconium ($Zr(N(CH_3)(C_2H_5))_4$) or the like may be used as a Zr-containing precursor. Tetrakis(ethylmethylamino)hafnium ($Hf(N(CH_3)(C_2H_5))_4$) or the like may be used.

The present embodiment may be implemented by, e.g., changing a process recipe of an existing substrate processing device. In case of changing a process recipe, the process recipe according to the present embodiment may be installed on an existing substrate processing device through an electrical communication line or a recording medium that stores the process recipe. In addition, a process recipe can be changed to the process recipe according to the present embodiment by operating an input/output device of the existing substrate processing device.

In the aforementioned embodiments, description has been made on an example where a film is formed by a substrate processing device which is a batch-type longitudinal device for processing a plurality of substrates at one time. However, the present disclosure is not limited thereto but may be suitably applied to a case where a film is formed by a single-type substrate processing device for processing one or a few substrates at one time. In the aforementioned embodiments, description has been made on an example where a film is formed by a substrate processing device having a hot-wall-type processing furnace. However, the present disclosure is not limited thereto but may be suitably applied to a case where a film is formed by a substrate processing device having a cold-wall-type processing furnace.

<Additional Aspects of the Present Disclosure>

Some aspects of the present disclosure will now be supplementarily stated.

(Supplementary Note 1)

According to one aspect of the present disclosure, there is provided a method of manufacturing a semiconductor device, the method including: loading a substrate into a processing chamber; forming a silicon nitride film on a surface of the substrate by supplying at least two kinds of process gases into the processing chamber; unloading the substrate having the silicon nitride film formed thereon from the processing chamber; and after unloading the substrate and before loading a subsequent substrate on which a film is to be formed into the processing chamber, supplying a plasma-excited NF3 gas as an etching gas into the processing chamber.

(Supplementary Note 2)

In the method of manufacturing a semiconductor device according to Supplementary Note 1, the method includes performing etching one time every end of the acts of loading the substrate, forming the silicon nitride film, and unloading the substrate.

(Supplementary Note 3)

In the method of manufacturing a semiconductor device according to Supplementary Note 1, the method includes, before and/or after the act of supplying the plasma-excited $NF_3$ gas for etching into the processing chamber, supplying a plasma-excited inert gas or a plasma-excited ammonia gas into the processing chamber.

(Supplementary Note 4)

In the method of manufacturing a semiconductor device according to Supplementary Note 1, during etching, plasma is intermittently generated while the $NF_3$ is continuously supplied.

(Supplementary Note 5)

In the method of manufacturing a semiconductor device according to Supplementary Note 1, during etching, plasma is intermittently generated while the $NF_3$ is intermittently supplied.

(Supplementary Note 6)

According to another aspect of the present disclosure, there is provided a method of manufacturing a semiconductor device, the method including: loading a substrate into a processing chamber for accommodating the substrate within the processing chamber; forming a silicon nitride film on a surface of the substrate; forming a silicon oxide film on the surface of the substrate; unloading the substrate from the processing chamber; and etching a film adhering to an inside of the processing chamber by supplying a NF3 gas as an etching gas into the processing chamber.

(Supplementary Note 7)

According to still another aspect of the present disclosure, there is provided a method of manufacturing a semiconductor device, the method including: loading a substrate into a processing chamber for accommodating the substrate within the processing chamber; forming a silicon nitride film on a surface of the substrate; unloading the substrate having the silicon nitride film formed thereon from the processing chamber; and etching a film adhering to an inside of the processing chamber by supplying a NF3 as an etching gas into the processing chamber, wherein the act of etching includes a first act of using the NF3 activated by plasma excitation and a second act of using the NF3 activated by heat rather than plasma excitation.

(Supplementary Note 8)

According to still another aspect of the present disclosure, there is provided a method of manufacturing a semiconductor device, the method including: loading a substrate into a processing chamber for accommodating the substrate within the processing chamber; forming a silicon nitride film on a surface of the substrate; unloading the substrate having the silicon nitride film formed thereon from the processing chamber; and etching a film adhering to an inside of the processing chamber by supplying a NF3 as an etching gas into the processing chamber, wherein the act of etching includes a first act of using the NF3 which is activated by plasma excitation and a second act of using the NF3 which is thermally activated by increasing a heating temperature of the processing chamber, while plasma-exciting the NF3, to become higher than a temperature of the first act.

(Supplementary Note 9)

According to still another aspect of the present disclosure, there is provided a method of manufacturing a semiconductor device, the method including: loading a substrate into a processing chamber for accommodating the substrate within the processing chamber; forming a silicon-rich silicon nitride film on a surface of the substrate; unloading the substrate from the processing chamber; and etching a film adhering to an inside of the processing chamber by supplying a NF3 as an etching gas into the processing chamber.

(Supplementary Note 10)

According to still another aspect of the present disclosure, there is provided a method of manufacturing a semiconductor device, with a means configured to supply a silane-based precursor and a nitriding gas into a reaction chamber, a reaction chamber configured to perform a desired process on a substrate by a reaction of a precursor gas, and an exhaust unit, the method including, between forming a silicon nitride (SiN) film on the substrate to be processed within the reaction chamber and forming a silicon nitride (SiN) film on a next substrate to be processed within the reaction chamber, introducing an etching gas into the reaction chamber to etch a silicon nitride (SiN) film.

(Supplementary Note 11)

In the method of manufacturing a semiconductor device according to Supplementary Note 10, wherein a $NF_3$ is used as the etching gas.

(Supplementary Note 12)

In the method of manufacturing a semiconductor device according to Supplementary Note 10, the method includes performing an etching reaction by exciting a $NF_3$ as the etching gas by plasma; and generating $N_2$ plasma independently of generation of $NF_3$ plasma.

(Supplementary Note 13)

In the method of manufacturing a semiconductor device according to Supplementary Note 10, the method includes performing an etching reaction by exciting a $NF_3$ as the etching gas by plasma; and generating $NH_3$ plasma independently of generation of $NF_3$ plasma.

(Supplementary Note 14)

According to still another aspect of the present disclosure, there is provided a method of manufacturing a semiconductor device, with a means configured to supply a silane-based precursor and a nitriding gas into a reaction chamber, a reaction chamber configured to perform a desired process on a substrate by a reaction of a precursor gas, and an exhaust unit, the method including, between forming a silicon nitride (SiN) film, which is higher in Si ratio than $Si_3N_4$, on the substrate to be processed within the reaction chamber and forming a silicon nitride (SiN) film on a next substrate to be processed within the reaction chamber, introducing an etching gas into the reaction chamber to etch a cumulative film.

(Supplementary Note 15)

According to another aspect of the present disclosure, there is provided a method of manufacturing a semiconductor device, with a means configured to supply a silane-based precursor and a nitriding gas into a reaction chamber, a reaction chamber configured to perform a desired process on a substrate by a reaction of a precursor gas, and an exhaust unit, the method including, between forming a silicon nitride (SiN) film on the substrate to be processed within the reaction chamber and forming a silicon nitride (SiN) film on a next substrate to be processed within the reaction chamber, introducing an etching gas into the reaction chamber to etch a silicon nitride (SiN) film, the etching being performed in at least one kind of temperature zone.

(Supplementary Note 16)

In the method of manufacturing a semiconductor device according to Supplementary Note 15, a $NF_3$ is used as the etching gas.

(Supplementary Note 17)

In the method of manufacturing a semiconductor device according to Supplementary Note 15, the method includes performing an etching reaction by exciting a $NF_3$ as the etching gas by plasma; generating $N_2$ plasma independently of generation of $NF_3$ plasma; and generating an inert gas plasma before or after the etching.

(Supplementary Note 18)

In the method of manufacturing a semiconductor device according to Supplementary Note 15, the method includes performing an etching reaction by exciting a $NF_3$ as the etching gas by plasma; generating $N_2$ plasma independently of generation of $NF_3$ plasma; and generating an inert gas plasma before and after the etching.

(Supplementary Note 19)

According to still another aspect of the present disclosure, there is provided a method of manufacturing a semiconductor device, with a means configured to supply a silane-based precursor and a nitriding gas into a reaction chamber, a means configured to supply a Si precursor and an oxidizing gas into the reaction chamber, a reaction chamber configured to perform a desired process on a substrate by a reaction of a precursor gas, and an exhaust unit, the method including, between forming a silicon nitride (SiN) film and a silicon oxide (SiO) film on the substrate to be processed within the reaction chamber and forming a film on a next substrate to be processed within the reaction chamber, introducing an etching gas into the reaction chamber to partially or wholly etch a cumulative film.

(Supplementary Note 20)

According to still another aspect of the present disclosure, there is provided a method of processing a substrate, the method including: loading a substrate into a processing chamber; forming a silicon nitride film on a surface of the substrate by supplying at least two kinds of process gases into the processing chamber; unloading the substrate having the silicon nitride film formed thereon from the processing chamber; and after unloading the substrate and before loading a subsequent substrate to be subjected to film-forming into the processing chamber, supplying a plasma-excited $NF_3$ gas as an etching gas into the processing chamber.

(Supplementary Note 21)

According to still another aspect of the present disclosure, there is provided a substrate processing device, including: a processing chamber configured to process a substrate; a plurality of process gas supply means configured to supply at least two kinds of process gases to the substrate; an etching gas supply means configured to supply a $NF_3$ gas as an etching gas into the processing chamber; a plasma excitation means configured to plasma-excite the $NF_3$ gas; an exhaust means configured to exhaust the processing chamber; and a control unit configured to control the plurality of process gas supply means, the etching gas supply means, the plasma excitation means and the exhaust means, wherein the control unit controls the plurality of process gas supply means, the etching gas supply means, the plasma excitation means and the exhaust means to supply at least two kinds of process gases to the substrate, form a silicon nitride film on a surface of the substrate, and then supply a plasma-excited $NF_3$ gas into the processing chamber to etch an inside of the processing chamber, without any substrate within the processing chamber.

(Supplementary Note 22)

According to still another aspect of the present disclosure, there is provided a method of manufacturing a semiconductor device, the method including: loading a substrate into a processing chamber; forming at least two kinds of films on the substrate within the processing chamber; unloading the substrate having the films formed thereon from the processing chamber; and after unloading the substrate, without any substrate within the processing chamber, supplying an etching gas for etching into the processing chamber, wherein the act of etching includes a first cleaning act of supplying a fluorine-containing gas activated by plasma excitation as the etching gas into the processing chamber, and a second cleaning act of supplying a fluorine-containing gas activated by heat as the etching gas into the processing chamber.

(Supplementary Note 23)

In the method of manufacturing a semiconductor device according to Supplementary Note 22, in the act of etching, before and/or after the plasma-excited $NF_3$ gas is supplied into the processing chamber, a plasma-excited inert gas or a plasma-excited ammonia gas (reactant gas) is supplied into the processing chamber.

(Supplementary Note 24)

In the method of manufacturing a semiconductor device according to Supplementary Note 22 or 23, in the act of etching, plasma is intermittently generated while the reactant gas is continuously supplied.

(Supplementary Note 25)

In the method of manufacturing a semiconductor device according to Supplementary Note 22 or 23, in the act of etching, plasma is intermittently generated while the reactant gas is intermittently supplied.

(Supplementary Note 26)

According to still another aspect of the present disclosure, there is provided the method of any one of Supplementary Notes 22 to 25, wherein the act of forming the films includes forming a silicon nitride film on the substrate; and forming a silicon oxide film on the substrate.

(Supplementary Note 27)

According to still another aspect of the present disclosure, there is provided the method of any one of Supplementary Notes 22 to 25, wherein the act of forming the films includes a first oxide film forming act in which a silicon oxide film is formed on the substrate; a nitride film forming act in which a silicon nitride film is formed on the substrate; and a second oxide film forming act in which a silicon oxide film is formed on the substrate.

(Supplementary Note 28)

According to still another aspect of the present disclosure, there is provided the method of any one of Supplementary Notes 22 to 25, wherein the act of etching includes a first cleaning act of using an $NF_3$ which is activated by plasma excitation and a second cleaning act of using an $NF_3$ which is thermally activated by increasing a heating temperature of the processing chamber while plasma-exciting the $NF_3$, to become higher than a temperature of the first cleaning act.

(Supplementary Note 29)

According to still another aspect of the present disclosure, there is provided a method of processing a substrate, the method including: loading a substrate into a processing chamber; forming at least two kinds of films on the substrate within the processing chamber; unloading the substrate having the films formed thereon from the processing chamber; and after unloading the substrate, without any substrate within the processing chamber, supplying an etching gas into the processing chamber, wherein the act of etching includes a first cleaning act of supplying a fluorine-containing gas activated by plasma excitation as the etching gas into the processing chamber, and a second cleaning act of supplying a fluorine-containing gas activated by heat as the etching gas into the processing chamber.

(Supplementary Note 30)

According to still another aspect of the present disclosure, there is provided a substrate processing device, including: a processing chamber configured to process a substrate; a plurality of process gas supply systems configured to supply at least two kinds of process gases to the substrate; an etching gas supply system configured to supply a fluorine-containing gas as an etching gas into the processing chamber; a plasma excitation unit configured to plasma-excite the fluorine-containing gas; a heating unit configured to heat the processing chamber; an exhaust system configured to exhaust the processing chamber; and a control unit configured to, by controlling the process gas supply systems, the etching gas supply system, the plasma excitation unit, the heating unit and the exhaust unit, supply the at least two kinds of process gases into the substrate, form at least two kinds of films on the substrate within the processing chamber, and then execute, without any substrate within the processing chamber, a first cleaning in which the fluorine-containing gas is activated by plasma excitation and is supplied into the processing chamber and a second cleaning in which the fluorine-containing gas is activated by heat and is supplied into the processing chamber.

(Supplementary Note 31)

According to still another aspect of the present disclosure, there is provided a program that causes a computer to execute the processes of: loading a substrate a processing chamber; forming at least two kinds of films on the substrate within the processing chamber; unloading the substrate having the films formed thereon from the processing chamber; and after unloading the substrate, without any substrate within the processing chamber, supplying an etching gas into the processing chamber, wherein the process of etching includes a first cleaning process of supplying a fluorine-containing gas activated by plasma excitation as the etching gas into the processing chamber, and a second cleaning process of supplying a fluorine-containing gas activated by heat as the etching gas into the processing chamber.

(Supplementary Note 32)

According to still another aspect of the present disclosure, there is provided a computer-readable recording medium which records a program that causes a computer to execute the processes of: loading a substrate into a processing chamber; forming at least two kinds of films on the substrate within the processing chamber; unloading the substrate having the films formed thereon from the processing chamber; and after unloading the substrate, without any substrate within the processing chamber, supplying an etching gas into the processing chamber, wherein the process of etching includes a first cleaning process of supplying a fluorine-containing gas activated by plasma excitation as the etching gas into the processing chamber, and a second cleaning process of supplying a fluorine-containing gas activated by heat as the etching gas into the processing chamber.

While different embodiments of the present disclosure have been described above, the present disclosure is not limited to these embodiments. Accordingly, the scope of the present disclosure is limited only by the claims.

The application is based upon and claims the benefit of priority from Japanese Patent Application No. 2012-066332, filed on Mar. 22, 2012 and Japanese Patent Application No. 2013-054711, filed on Mar. 18, 2013, the entire contents of which are incorporated herein by reference.

EXPLANATION OF REFERENCE NUMERALS

101: substrate processing device, 115: boat elevator, 121: controller, 200: wafer, 201: processing chamber, 202: processing furnace, 203: reaction tube, 207: heater, 209: manifold, 217: boat, 219: seal cap, 231: exhaust pipe, 244: APC valve, 245: pressure sensor, 246: vacuum pump, 263: temperature sensor, 267: rotary mechanism, 232*a*: silicon precursor gas supply pipe, 232*b*: nitrogen-containing gas supply pipe, 252*a* and 252*b*: cleaning gas supply pipe, 241*a*, 241*b*, 241*c*, 241*d*, 253*a* and 253*b*: mass flow controller, 249*a* and 249*b*: nozzle, 232*c* and 232*d*: inert gas supply pipe

INDUSTRIAL USE OF THE PRESENT INVENTION

In case where a laminated film including at least two kinds of films is formed on a substrate, gas cleaning can be implemented after the substrate is unloaded. Thus, there is provided a substrate processing device capable of increasing the device operation rate.

What is claimed is:

1. A method of manufacturing a semiconductor device, comprising:
loading a substrate into a processing chamber;
forming at least two kinds of films including a nitride film and an oxide film on the substrate within the processing chamber;
unloading the substrate having the films formed thereon from the processing chamber; and
after unloading the substrate, etching by supplying an etching gas into the processing chamber without any substrate within the processing chamber, the act of etching including a first etching and a second etching,
the act of the first etching including a cleaning of supplying a fluorine-containing gas activated by plasma excitation as the etching gas into the processing chamber, and
the act of the second etching including a cleaning of supplying a fluorine-containing gas activated by heat without the plasma excitation as the etching gas into the processing chamber.

2. The method of claim 1, wherein, in the act of the first etching, before and/or after the plasma-excited $NF_3$ gas is supplied into the processing chamber, a plasma-excited inert gas or a plasma-excited reactant gas is supplied into the processing chamber.

3. The method of claim 1, wherein, in the act of the first etching, plasma is intermittently generated while the reactant gas is continuously supplied.

4. The method of claim 1, wherein, in the act of the first etching, plasma is intermittently generated while the reactant gas is intermittently supplied.

5. The method of claim 1, wherein the act of forming the films includes forming a silicon nitride film on the substrate; and forming a silicon oxide film on the substrate.

6. The method of claim 1, wherein the act of forming the films includes a first oxide film forming in which a silicon oxide film is formed on the substrate; a nitride film forming in which a silicon nitride film is formed on the substrate; and a second oxide film forming in which a silicon oxide film is formed on the substrate.

7. The method of claim 1, wherein the act of the first etching includes cleaning of using an $NF_3$ which is activated by plasma excitation and the act of the second etching includes cleaning of using an $NF_3$ which is thermally activated by increasing a heating temperature of the processing chamber without plasma-exciting the $NF_3$, to become higher than a temperature of the first etching.

8. The method of claim 1, wherein, the etching gas is at least one selected from the group consisting of a halogen-containing gas including fluorine (F).

9. A method of processing a substrate, comprising:
loading one or more substrates into a processing chamber;
forming at least two kinds of films including a nitride film and an oxide film on the substrate within the processing chamber;
unloading the one or more substrates having the films formed thereon from the processing chamber; and
after unloading all the substrates, etching by supplying an etching gas into the processing chamber without any substrate within the processing chamber, the act of etching including a first etching and a second etching,
the act of the first etching including a cleaning of supplying a fluorine-containing gas activated by plasma excitation as the etching gas into the processing chamber, and the act of the second etching including a cleaning of supplying a fluorine-containing gas activated by heat without the plasma excitation as the etching gas into the processing chamber.

10. The method of claim 9, wherein, the etching gas is at least one selected from the group consisting of a halogen-containing gas including fluorine (F).

11. A method for manufacturing a semiconductor device, comprising:
   loading a substrate into a processing chamber;
   forming a silicon nitride film and a silicon oxide film on a surface of the substrate by supplying at least two kinds of process gases into the processing chamber;
   unloading the substrate having the silicon nitride film formed thereon from the processing chamber; and
   after unloading the substrate and before loading a subsequent substrate on which a film is to be formed into the processing chamber, supplying a plasma-excited fluorine-containing gas as an etching gas into the processing chamber, and supplying a heated fluorine-containing gas without the plasma excitation as an etching gas into the processing chamber.

12. The method of claim 11, further comprising performing etching one time every end of the acts of loading the substrate, forming the silicon nitride film, and unloading the substrate.

13. The method of claim 11, further comprising, before and/or after the act of supplying the plasma-excited fluorine-containing gas for etching into the processing chamber, supplying a plasma-excited inert gas or a plasma-excited ammonia gas into the processing chamber.

14. The method of claim 11, wherein, during etching, plasma is intermittently generated while the fluorine-containing gas is continuously supplied.

15. The method of claim 11, wherein, during etching, plasma is intermittently generated while the fluorine-containing gas is intermittently supplied.

16. The method of claim 11, wherein, the etching gas is at least one selected from the group consisting of a halogen-containing gas including fluorine (F).

* * * * *